US011487383B2

(12) United States Patent
Lee

(10) Patent No.: US 11,487,383 B2
(45) Date of Patent: Nov. 1, 2022

(54) ELECTRONIC DEVICE

(71) Applicant: Samsung Display Co., Ltd., Yongin-Si (KR)

(72) Inventor: Soongyu Lee, Seoul (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/357,874

(22) Filed: Jun. 24, 2021

(65) Prior Publication Data

US 2022/0197465 A1   Jun. 23, 2022

(30) Foreign Application Priority Data

Dec. 23, 2020   (KR) ........................ 10-2020-0182583

(51) Int. Cl.
| G06F 3/041 | (2006.01) |
| G06F 3/044 | (2006.01) |
| H01L 27/32 | (2006.01) |
| G06F 3/0354 | (2013.01) |

(52) U.S. Cl.
CPC ...... G06F 3/04164 (2019.05); G06F 3/03545 (2013.01); G06F 3/0412 (2013.01); G06F 3/0445 (2019.05); H01L 27/323 (2013.01)

(58) Field of Classification Search
CPC ............ G06F 3/04164; G06F 3/03545; G06F 3/041–047; G06F 2204/041–04114
See application file for complete search history.

(56) References Cited

U.S. PATENT DOCUMENTS

| 9,335,849 B2 | 5/2016 | Tsai |
| 10,788,923 B2 | 9/2020 | Kong |
| 2019/0102021 A1 | 4/2019 | Jang et al. |
| 2019/0121455 A1* | 4/2019 | Hara ........................ G06F 3/03 |
| 2020/0210021 A1 | 7/2020 | Ju et al. |
| 2021/0200404 A1* | 7/2021 | Kim ....................... G06F 3/0412 |

FOREIGN PATENT DOCUMENTS

| KR | 10-1662413 B1 | 10/2016 |
| KR | 10-2019-0038026 A | 4/2019 |
| KR | 10-2019-0070178 A | 6/2019 |
| KR | 10-2019-0079369 A | 7/2019 |
| KR | 10-2020-0082506 A | 7/2020 |

\* cited by examiner

*Primary Examiner* — Sanjiv D. Patel
(74) *Attorney, Agent, or Firm* — Innovation Counsel LLP

(57) ABSTRACT

An electronic device includes a display panel displaying an image, an input sensor disposed on the display panel, and a sensor controller electrically connected to the input sensor. The sensor controller provides search signals to the input sensor in a first search period in a first input sensing frame in a first mode, senses a first input provided by an input device through the input sensor in the first mode, generates an integrated signal using a sensing signal and one of the search signals, provides the integrated signal to the input sensor in an integrated sensing period in a second input sensing frame in a second mode, and senses a second input in the second mode. The search signals are communicated through different protocols, respectively.

20 Claims, 22 Drawing Sheets

ELECTRONIC DEVICE

CROSS-REFERENCE TO RELATED APPLICATION

This U.S. non-provisional patent application claims priority under 35 U.S.C. § 119 to Korean Patent Application No. 10-2020-0182583, filed on Dec. 23, 2020; the Korean Patent Application is incorporated by reference.

BACKGROUND

1. Field

The technical field relates to an electronic device capable of receiving inputs.

2. Description of the Related Art

An electronic device (such as a television, mobile phone, tablet computer, navigation unit, or game unit) may include a display device to display images. The electronic device may include an input sensor for sensing user inputs.

The input sensor may sense a touch or pressure generated by a user's body part, an electronic pen, or a stylus.

SUMMARY

Embodiments may be related to an electronic device capable of supporting multiple protocols to communicate with various types of input devices.

Embodiments may be related to an electronic device including a display panel displaying an image, an input sensor disposed on the display panel, and a sensor controller sensing a first input generated by at least one of a plurality of input devices through the input sensor in a first mode and sensing a second input different from the first input in a second mode. A first input sensing frame of the first mode includes a first search period in which a plurality of search signals is applied to the input sensor, and a second input sensing frame of the second mode includes an integrated sensing period in which an integrated signal obtained by integrating at least one of the search signals with a sensing signal is applied to the input sensor.

The search signals include search signals that can be communicated through different protocols, respectively.

An embodiment may be related to an electronic device. The electronic device may include a display panel displaying an image, an input sensor disposed on the display panel, and a sensor controller electrically connected to the input sensor. The sensor controller may provide search signals to the input sensor in a first search period in a first input sensing frame in a first mode, may sense at least one first input provided by at least one input device through the input sensor in the first mode, may generate at least one integrated signal using a sensing signal and at least one of the search signals, may provide the at least one integrated signal to the input sensor in an integrated sensing period in a second input sensing frame in a second mode, and may sense at least one second input in the second mode. The search signals may be communicated through different protocols, respectively.

The search signals may include the following signals: a first search signal communicated through a first protocol; and a second search signal communicated through a second protocol different from the first protocol.

The at least one integrated signal may include a first integrated sensing signal and a second integrated sensing signal. The sensor controller generates the first integrated sensing signal using characteristics of the first search signal and characteristics of the sensing signal. The sensor controller generates the second integrated sensing signal using characteristics of the second search signal and the characteristics of the sensing signal. The integrated sensing period may include a first sensing period and a second sensing period. The sensor controller may provide the first integrated sensing signal to the input sensor in the first sensing period. The sensor controller may provide the second integrated sensing signal to the input sensor in the second sensing period.

The integrated sensing period may include a first synchronization period and a second synchronization period. The first synchronization period may precede the first sensing period. The second synchronization period may be positioned between the first sensing period and the second sensing period. The sensor controller may provide exactly one of an instance of the first search signal and a first instance of the sensing signal to the input sensor in the first synchronization period. The sensor controller may provide exactly one of an instance of the second search signal and a second instance of the sensing signal to the input sensor in the second synchronization period.

The at least one integrated signal may include a first integrated sensing signal. The sensor controller generates the first integrated sensing signal using characteristics of the first search signal and characteristics of the sensing signal. The integrated sensing period may include a sensing period and a second search period. The sensor controller may provide the first integrated sensing signal to the input sensor in the sensing period. The sensor controller may provide the second search signal to the input sensor in the second search period.

The integrated sensing period may include a first synchronization period preceding the first sensing period. The sensor controller may provide exactly one of an instance of the first search signal and an instance of the sensing signal to the input sensor in the first synchronization period.

The second input sensing frame may include a waiting period. The sensor controller waits for a third search signal in the waiting period. The third search signal may be communicated through a third protocol different from each of the first protocol and the second protocol.

The first search period may include a first uplink period and a second uplink period. The sensor controller may provide the first search signal to the input sensor in the first uplink period. The sensor controller may provide the second search signal to the input sensor in the second uplink period. The first uplink period and the second uplink period may not overlap each other in time.

The first search period may include a first response period and a second response period respectively following the first uplink period and the second uplink period. The sensor controller receives a first response signal corresponding to the first search signal or waits for the first response signal. The sensor controller receives a second response signal corresponding to the second search signal or waits for the second response signal. The first response period may not overlap the second uplink period. The second response period may not overlap the first uplink period.

The first input sensing frame may include a communication period following the first search period. The sensor controller senses the at least one first input in the communication period.

The communication period may include a downlink period. The sensor controller may perform data communication a first input device supporting the first protocol in the downlink period. The first response signal may be received during the first response period, and wherein no second response signal may be received during the second response period.

The communication period may include a downlink period. The sensor controller may perform data communication with a second input device supporting the second protocol in the downlink period, wherein no first response signal may be received during the first response period. The second response signal may be received during the second response period.

The first response signal may be received during the first response period. The second response signal may be received during the second response period. The communication period may include a first downlink period and a second downlink period. The sensor controller may perform first data communication with a first input device supporting the first protocol in the first downlink period. The sensor controller may perform second data communication with a second input device supporting the second protocol in the second downlink period.

The first downlink period may not overlap the second downlink period in time.

The second input sensing frame may include a mutual-capacitance sensing period. The sensor controller may provide a mutual-capacitance sensing signal to the input sensor in the mutual-capacitance sensing period.

The input sensor may include the following elements: first sensing electrodes; and second sensing electrodes electrically insulated from the first sensing electrodes.

The sensor controller may transmit instances of the mutual-capacitance sensing signal to some of the first sensing electrodes and may receive instances of a reception signal corresponding to the mutual-capacitance sensing signal from some of the second sensing electrodes during the mutual-capacitance sensing period.

The sensor controller may select either the first sensing electrodes or the second sensing electrodes as selected sensing electrodes and may provide instances of the at least one integrated signal to the selected sensing electrodes during the integrated sensing period.

The integrated sensing period may precede the mutual-capacitance sensing period in the second input sensing frame.

The mutual-capacitance sensing period may precede the integrated sensing period in the second input sensing frame.

The electronic device outputs search signals that can be communicated through different protocols during the search period of the first input sensing frame; thus, the access of various types of input devices to the electronic device is sensed.

An integrated signal (including characteristics of a search signal and a sensing signal) is provided to the input sensor during the integrated sensing period of the second input sensing frame. Accordingly, even when the electronic device operates at a high speed, the access of various types of input devices to the electronic device is sensed, and satisfactory sensing performance with respect to the user's touch input is maintained/attained.

DETAILED DESCRIPTION

Figure 1:
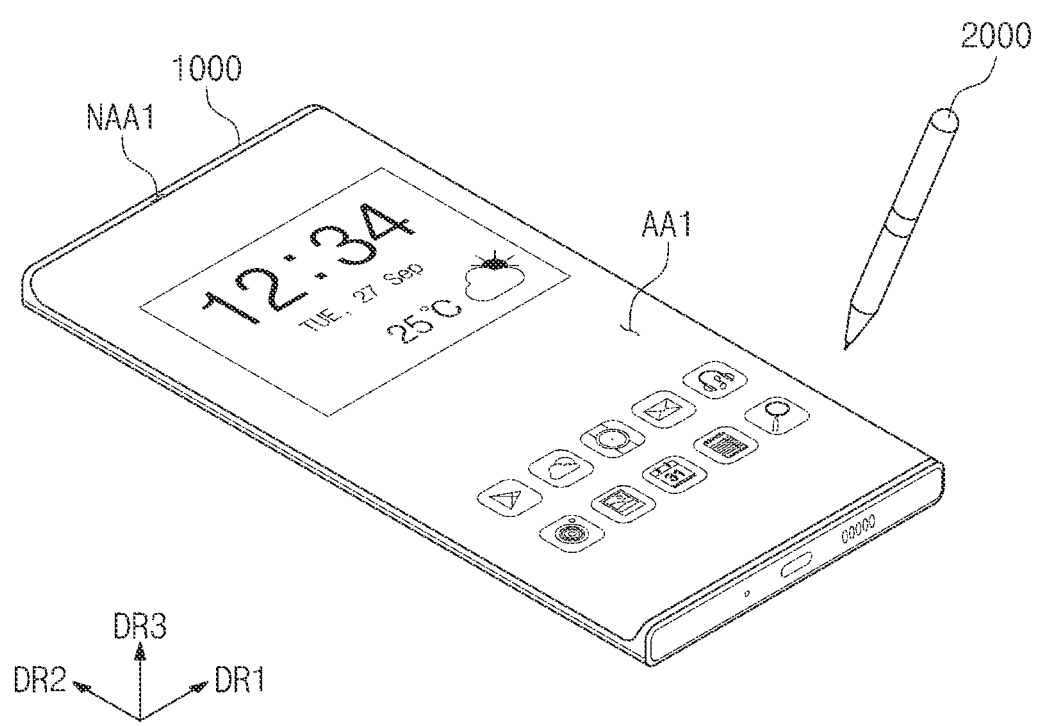
FIG. 1 is a perspective view showing an electronic device and an input device according to an embodiment.

Example embodiments are described with reference to the drawings.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first (or first-set)," "second (or second-set)," etc., respectively.

When a first element is referred to as being "on," "connected to," or "coupled to" a second element, the first element can be directly or indirectly on, connected to, or coupled to the second element with or without one or more intervening elements.

Like numerals may refer to like elements throughout. In the drawings, dimension of components may be exaggerated for effective description.

Singular forms, "a", "an" and "the" may represent plural forms as well, unless the context clearly indicates otherwise. The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "fold" may mean "bend." The term "body" may mean "body part." The term "pattern" may mean "member." The term "include" may mean "be formed/made of." The term "during" may mean "in" or "throughout." The term "terminate" may mean "end." The term "follow" may mean "immediately follow." The term "precede" may mean "immediately precede." The term "integrate" may mean "combine" or "mix." The term "integrated" may mean "mixed" or "hybrid." The expression "signal" may mean one or more instances and/or one or more characteristics of the signal.

FIG. 1 is a perspective view showing an electronic device 1000 and an input device 2000 according to an embodiment.

Referring to FIG. 1, the electronic device 1000 may be activated in response to electrical signals. The electronic device 1000 may be a mobile phone, a tablet computer, a car navigation unit, a game unit, or a wearable device.

The electronic device 1000 may include an active area AA1 and a peripheral area NAA1. The electronic device 1000 may display an image through the active area AA1. The active area AA1 may include a surface defined by a first direction DR1 and a second direction DR2. The peripheral area NAA1 may surround the active area AA1.

A thickness direction of the electronic device 1000 may be substantially parallel to a third direction DR3 different from the directions DR1 and DR2. Front (or upper) and rear (or lower) surfaces of members of the electronic device 1000 may be defined with respect to the third direction DR3.

The electronic device 1000 shown in FIG. 1 may sense an input generated by a user's touch and/or an input generated by an input device 2000. The input device 2000 may not be a user's body part. The electronic device 1000 may sense inputs generated by a plurality of input devices. The input generated by the input device 2000 may be referred to as a first input. For example, the input device 2000 may be an active pen, a stylus pen, a touch pen, an electronic pen, or the like. The input generated by the user's touch may be referred to as a second input. The second input may include inputs of various forms, such as a touch by a portion of the user's, light, heat, or pressure.

The electronic device 1000 and the input device 2000 may communicate bi-directionally with each other. The electronic device 1000 may apply a search signal to the input device 2000 to search the input device 2000. The search signal may be transmitted to the input device 2000 from the electronic device 1000, and the search signal may be referred to as an upward search signal. The search signal may be transmitted to the electronic device 1000 from the input device 2000, such that the electronic device 1000 may search the input device 2000 in response to the search signal, and this search signal may be referred to as a downward search signal. For example, the search signal may include a synchronization signal or information about the electronic device 1000.

When a communication between the input device 2000 and the electronic device 1000 is initiated, the input device 2000 may apply a downlink signal to the electronic device 1000. The downlink signal may include a synchronization signal or status information of the input device 2000. For example, the downlink signal may include location information of the input device 2000, battery information of the input device 2000, slope information of the input device 2000, and/or other information stored in the input device 2000.

Figure 2:
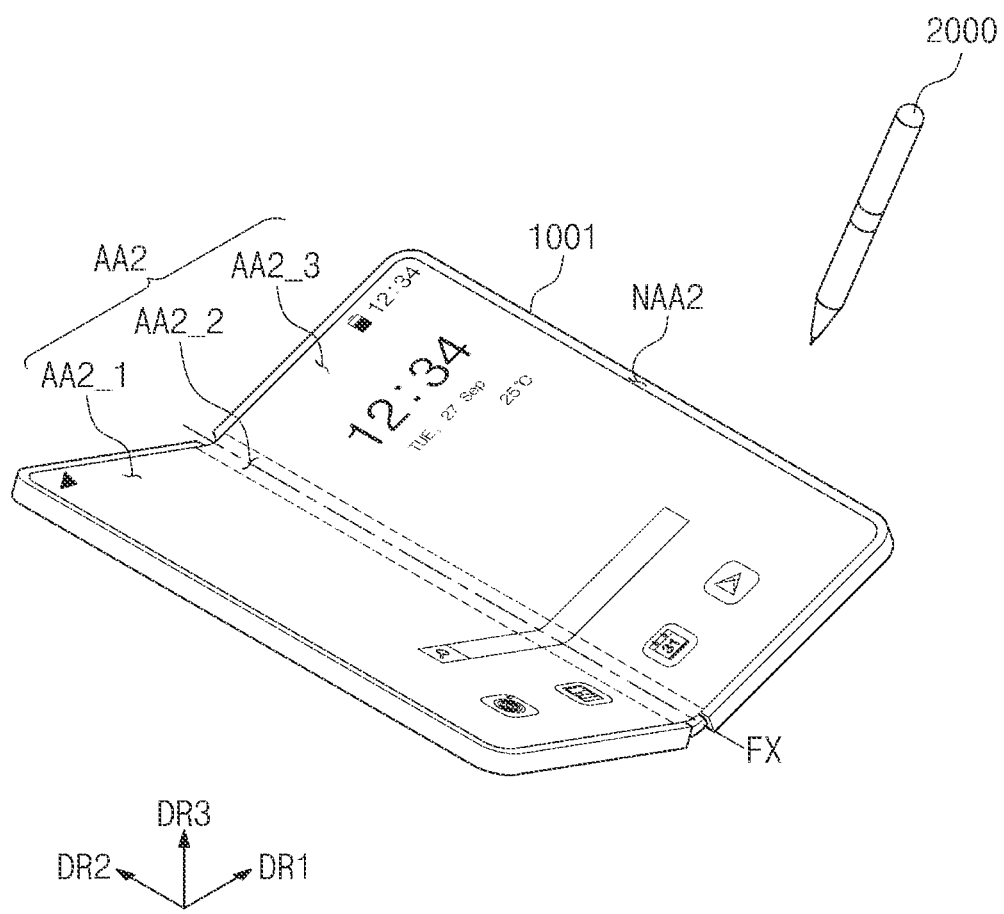
FIG. 2 is a perspective view showing an electronic device and an input device according to an embodiment.

FIG. 2 is a perspective view showing an electronic device 1001 and an input device 2000 according to an embodiment. Some elements of the electronic device 1001 may be analogous to or identical to some elements of the electronic device illustrated in FIG. 1.

Referring to FIG. 2, the electronic device 1001 may display an image through an active area AA2. FIG. 2 shows the electronic device 1001 bent at a (predetermined) angle. When the electronic device 1001 is in an unfolded state, the active area AA2 may be on a plane defined by the first direction DR1 and the second direction DR2.

The active area AA2 may include a first area AA2_1, a second area AA2_2, and a third area AA2_3. The first area AA2_1, the second area AA2_2, and the third area AA2_3 may be sequentially arranged in the first direction DR1. The second area AA2_2 may be bent and/or folded with respect to a bending/folding axis FX extending in the second direction DR2. The first area AA2_1 and the third area AA2_3 may be referred to as non-folding areas, and the second area AA2_2 may be referred to as a folding area.

When the electronic device 1001 is folded, the first area AA2_1 and the third area AA2_3 may face each other. Accordingly, the active area AA2 may be concealed when the electronic device 1001 is completely folded. According to an embodiment, the electronic device 1001 may be folded to allow the first area AA2_1 and the third area AA2_3 to face opposite directions opposite. In this case, the active area AA2 may be exposed.

FIG. 2 shows one folding area and two non-folding areas. The electronic device 1001 may include three or more non-folding areas and may include folding areas disposed between non-folding areas.

As shown in FIG. 2, the folding axis FX extends in the second direction DR2. The folding axis FX may extend in a direction substantially parallel to the first direction DR1. In this case, the first area AA2_1, the second area AA2_2, and the third area AA2_3 may be sequentially arranged in the second direction DR2.

The active area AA2 may overlap at least one electronic module. For example, the electronic modules may include a camera module and a proximity illumination sensor. The electronic modules may receive an external input applied through the active area AA2 or may provide an output through the active area AA2. A portion of the active area AA2 overlapping the camera module and the proximity illumination sensor may have a transmittance higher than that of the other portion of the active area AA2. Accordingly, an area in which the electronic modules are disposed may not be required to be provided in a peripheral area NAA2 around the active area AA2. As a result, a ratio of the active area AA2 to a front surface of the electronic device 1001 may be maximized.

The electronic device 1001 and the input device 2000 may bi-directionally communicate with each other. The electronic device 1001 may apply a search signal to the input device 2000. The input device 2000 may apply a downlink signal to the electronic device 1001. The electronic device 1001 may sense a position of the input device 2000 using the information provided from the input device 2000.

Figure 3:
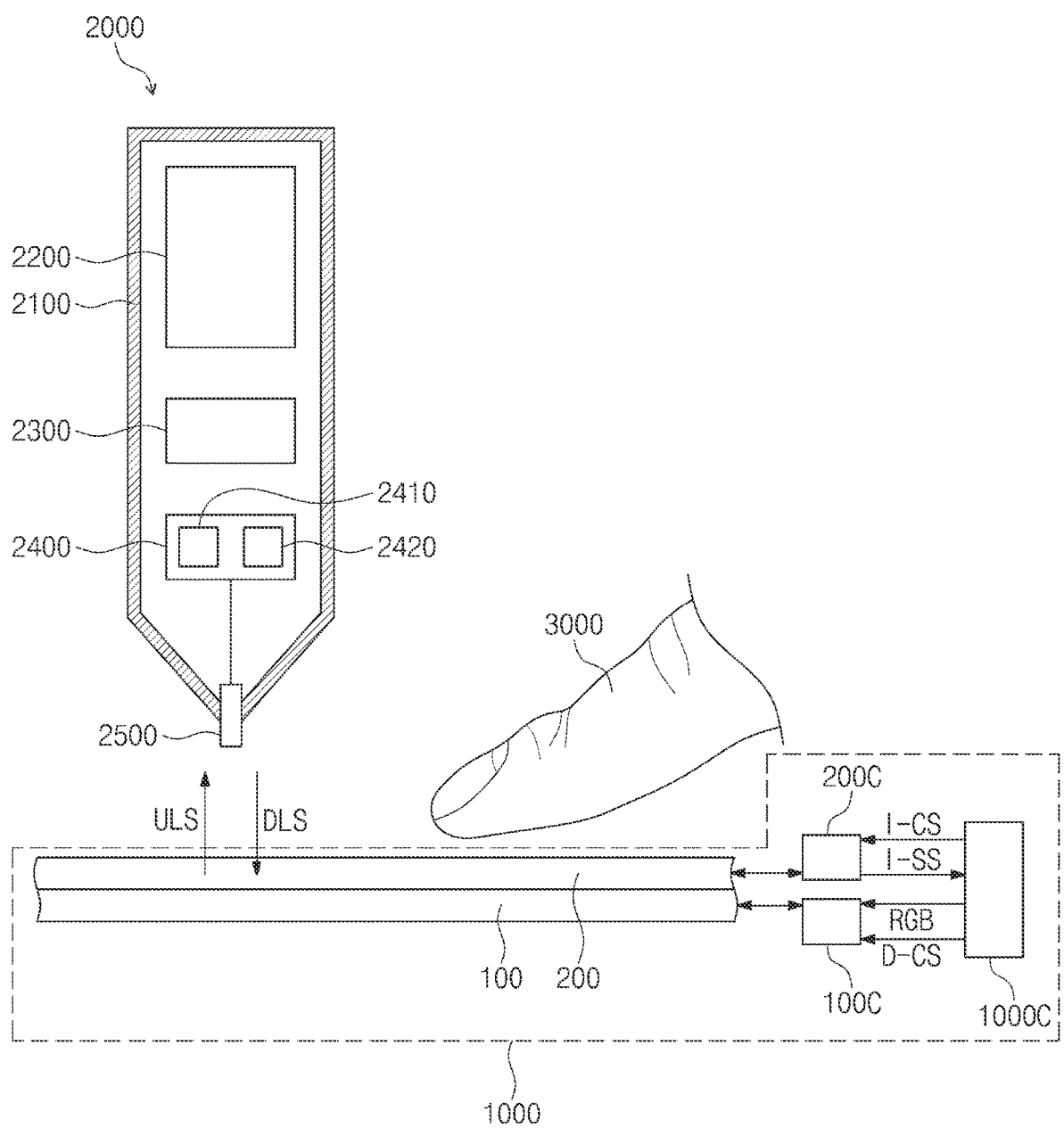
FIG. 3 is a block diagram schematically showing an electronic device and an input device according to an embodiment.

FIG. 3 is a block diagram schematically showing an electronic device 1000 and an input device 2000 according to an embodiment.

Referring to FIG. 3, the electronic device 1000 may include a display panel 100, an input sensor 200, a panel driver 100C, a sensor controller 200C, and a main controller 1000C.

The display panel 100 may be a light emitting type display panel. For example, the display panel 100 may be an organic light emitting display panel, an inorganic light emitting display panel, a quantum dot display panel, a micro-LED display panel, or a nano-LED display panel.

The input sensor 200 may be disposed on the display panel 100. The input sensor 200 may sense a first input generated by the input device 2000 and a second input generated by a user's body part 3000.

The main controller 1000C may control an overall operation of the electronic device 1000. For example, the main controller 1000C may control an operation of the panel driver 100C and the sensor controller 200C. The main controller 1000C may include at least one microprocessor, and the main controller 1000C may be referred to as a host.

The panel driver 100C may control the display panel 100. The main controller 1000C may further include a graphics controller. The panel driver 100C may receive image data RGB and control signals D-CS from the main controller 1000C. The control signals D-CS may include a vertical synchronization signal, a horizontal synchronization signal, a main clock, and a data enable signal. The panel driver 100C may generate a vertical start signal and a horizontal start signal based on the control signals D-CS to control a timing at which signals are applied to the display panel 100.

The sensor controller 200C may control the input sensor 200. The sensor controller 200C may receive a sensing control signal I-CS from the main controller 1000C. The sensing control signal I-CS may include a mode determination signal (to determine a driving mode of the sensor controller 200C) and a clock signal. The sensor controller 200C may operate in a first mode to sense the first input by the input device 2000 or in a second mode to sense the second input by the user's body 3000 based on the sensing control signal I-CS. When the user selects to enter the first mode through a user interface, the first mode may be activated. When the input device 2000 is found after the electronic device 1000 searches for the input device 2000, the first mode may be activated. When the first mode is not activated, the sensor controller 200C may operate in the second mode. The sensor controller 200C may operate in the second mode during a normal state.

The sensor controller 200C may calculate coordinate information of the first input or the second input based on the signal from the input sensor 200 and may provide a coordinate signal I-SS having the coordinate information to the main controller 1000C. The main controller 1000C may perform an operation corresponding to the first input or the second input based on the coordinate signal I-SS. For example, the main controller 1000C may drive the panel driver 100C based on the coordinate signal I-SS such that the display panel 100 displays a new image.

The input device 2000 may include a housing 2100, a power supply 2200, a pen controller 2300, a communication module 2400, and a pen electrode 2500. The input device 2000 may further include an electrode switch to switch on/off a signal transmission mode or a signal reception mode, a pressure sensor to sense a pressure, a memory to store information, and/or a gyro sensor to sense a rotation.

The housing 2100 may have a pen shape and may include an accommodating space. The power supply 2200, the pen controller 2300, the communication module 2400, and the pen electrode 2500 may be accommodated in the accommodating space of the housing 2100.

The power supply 2200 may supply a power to modules in the input device 2000, e.g., the pen controller 2300, the communication module 2400, and the like. The power supply 2200 may include a battery or a high capacity capacitor.

The pen controller 2300 may control an operation of the input device 2000. The pen controller 2300 may be an application-specific integrated circuit (ASIC). The pen controller 2300 may operate according to a designed program.

The communication module 2400 may include a transmitter circuit 2410 and a receiver circuit 2420. The transmitter circuit 2410 may output a downlink signal DLS to the input sensor 200. The receiver circuit 2420 may receive a search signal ULS from the input sensor 200. The search signal ULS may be an upward search signal provided to the input device 2000 from the electronic device 1000. The transmitter circuit 2410 may receive a signal from the pen controller 2300 and may modulate the signal into a signal that is able to be sensed by the input sensor 200, and the receiver circuit 2420 may modulate a signal from the input sensor 200 into a signal that is able to be processed by the pen controller 2300.

The pen electrode 2500 may be electrically connected to the communication module 2400. A portion of the pen electrode 2500 may protrude from the housing 2100. The input device 2000 may further include a cover housing that covers the pen electrode 2500. The pen electrode 2500 may be embedded in the housing 2100.

Figure 4A:
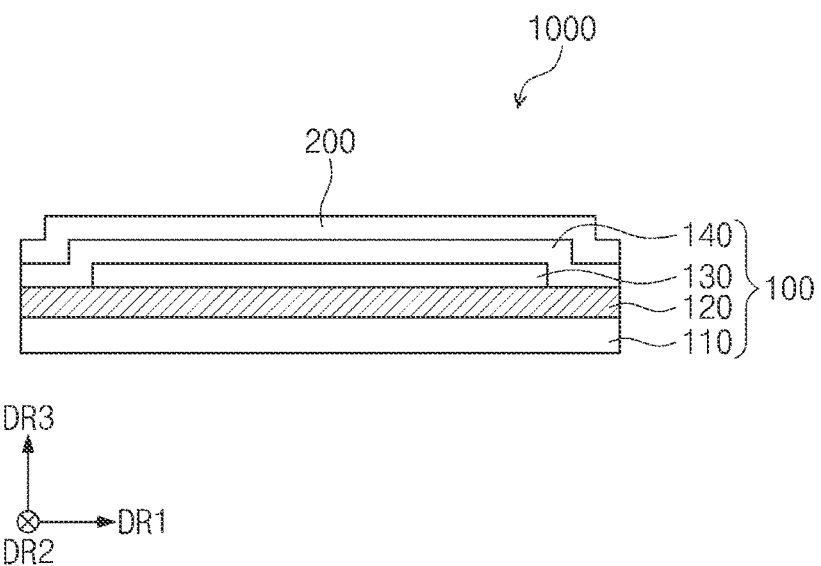
FIG. 4A is a cross-sectional view showing an electronic device according to an embodiment.

FIG. 4A is a cross-sectional view showing the electronic device 1000 according to an embodiment.

Referring to FIG. 4A, the electronic device 1000 may include the display panel 100 and the input sensor 200. The display panel 100 may include a base layer 110, a circuit layer 120, a light emitting element layer 130, and an encapsulation layer 140.

The base layer 110 may provide a base surface on which the circuit layer 120 is disposed. The base layer 110 may be a glass substrate, a metal substrate, or a polymer substrate. The base layer 110 may be/include an inorganic layer, an organic layer, or a composite material layer.

The base layer 110 may have a multi-layer structure. For instance, the base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. Each of the first and second synthetic resin layers may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin.

The circuit layer 120 may be disposed on the base layer 110. The circuit layer 120 may include an insulating layer, a semiconductor pattern, a conductive pattern, and a signal line. An insulating layer, a semiconductor layer, and a conductive layer may be formed on the base layer 110 by a coating or depositing process. The insulating layer, the semiconductor layer, and the conductive layer may be patterned through several photolithography processes. The semiconductor pattern, the conductive pattern, and the signal line included in the circuit layer 120 may be formed.

The light emitting element layer 130 may be disposed on the circuit layer 120. The light emitting element layer 130 may include a light emitting element. For example, the light emitting element layer 130 may include an organic light emitting material, an inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from external substances such as moisture, oxygen, and dust particles.

The input sensor 200 may be formed on the display panel 100 through successive processes. The input sensor 200 may be disposed directly on the display panel 100. No intervening elements may be provided between the input sensor 200 and the display panel 100. No separate adhesive member may be disposed between the input sensor 200 and the display panel 100. Alternatively, the input sensor 200 may be coupled with the display panel 100 by an adhesive layer.

Figure 4B:
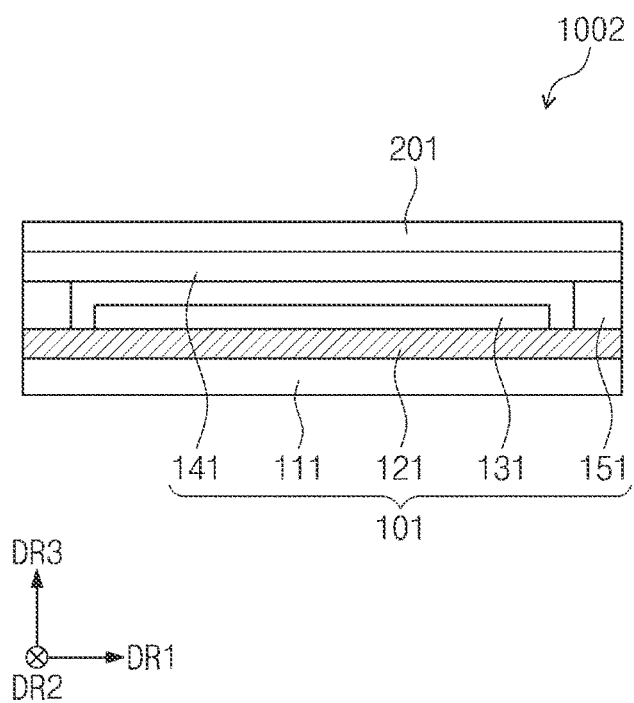
FIG. 4B is a cross-sectional view showing an electronic device according to an embodiment.

FIG. 4B is a cross-sectional view showing an electronic device 1002 according to an embodiment.

Referring to FIG. 4B, the electronic device 1002 may include a display panel 101 and an input sensor 201. The display panel 101 may include a base substrate 111, a circuit layer 121, a light emitting element layer 131, an encapsulation substrate 141, and a coupling member 151.

Each of the base substrate 111 and the encapsulation substrate 141 may be a glass substrate, a metal substrate, or a polymer substrate.

The coupling member 151 may be disposed between the base substrate 111 and the encapsulation substrate 141. The encapsulation substrate 141 may be coupled with the base substrate 111 or the circuit layer 121 by the coupling member 151. The coupling member 151 may include an inorganic material or an organic material. For example, the inorganic material may include a frit seal, and the organic material may include a photo-curable resin or a photo-plastic resin.

The input sensor 201 may be disposed directly on the encapsulation substrate 141. No intervening elements may be provided between the input sensor 201 and the encapsulation substrate 141. No separate adhesive member may be disposed between the input sensor 201 and the encapsulation substrate 141. An adhesive layer may be further disposed between the input sensor 201 and the encapsulation substrate 141.

Figure 5:
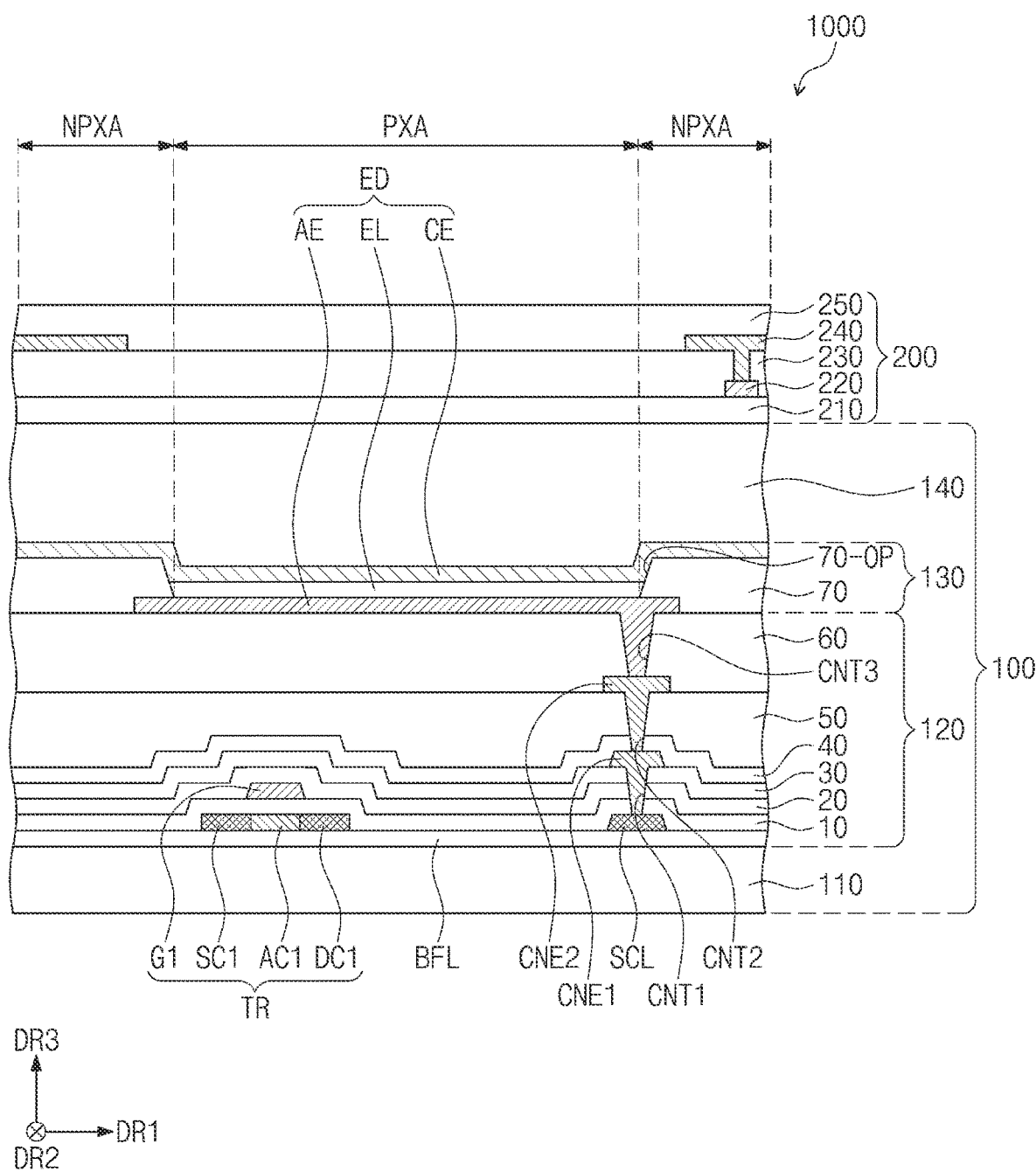
FIG. 5 is a cross-sectional view showing an electronic device according to an embodiment.

FIG. 5 is a cross-sectional view showing the electronic device 1000 according to an embodiment.

Referring to FIG. 5, at least one inorganic layer may be formed on an upper surface of the base layer 110. The inorganic layer may include at least one of aluminum oxide, titanium oxide, silicon oxide, silicon oxynitride, zirconium oxide, and hafnium oxide. The inorganic layer may include multiple layers. The inorganic layers may include a barrier layer and/or a buffer layer BFL.

The buffer layer BFL may increase an adhesion between the base layer 110 and the semiconductor pattern. The buffer layer BFL may include a silicon oxide layer and a silicon nitride layer, and the silicon oxide layer and the silicon nitride layer may be alternately stacked with each other.

The semiconductor pattern may be disposed on the buffer layer BFL. The semiconductor pattern may include polysilicon. The semiconductor pattern may include amorphous silicon, low-temperature polycrystalline silicon, or oxide semiconductor.

FIG. 5 shows only a portion of the semiconductor pattern, and the semiconductor pattern may be further disposed in other areas. The semiconductor pattern may be arranged with a specific rule over the pixels. The semiconductor pattern may have different electrical properties depending on whether it is doped or not or whether it is doped with an N-type dopant or a P-type dopant. The semiconductor pattern may include a first region with high conductivity and a second region with low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or may be doped at a concentration lower than the first region.

The first region may have a conductivity greater than that of the second region and may serve as a source/drain electrode, a connection electrode, or a signal line. The second region may function as a channel of a transistor.

Each of the pixels may include seven transistors, one capacitor, and a light emitting element ED. FIG. 5 shows one transistor TR and the light emitting element ED included in the pixel.

The transistor TR may include a source area SC1, a channel area AC1, a drain area DC1, and a gate G1. The source area SC1, the channel area AC1, and the drain area DC1 may be parts of the semiconductor pattern. The source area SC1 and the drain area DC1 may extend in opposite directions from the channel area AC1. FIG. 5 shows a portion of the connection signal line SCL, which may be a portion of the semiconductor pattern. The connection signal line SCL may be electrically connected to the drain area DC1 of the transistor TR.

A first insulating layer 10 may be disposed on the buffer layer BFL. The first insulating layer 10 may overlap the pixels and may cover the semiconductor pattern. The first insulating layer 10 may be/include an inorganic layer and/or an organic layer and may have a single-layer or multi-layer structure. The first insulating layer 10 may include at least one of aluminum oxide, titanium oxide, silicon oxide, silicon nitride, silicon oxynitride, zirconium oxide, and hafnium oxide. The first insulating layer 10 may have a single-layer structure of a silicon oxide layer. Another insulating layer of the circuit layer 120 may be/include an inorganic layer and/or an organic layer and may have a single-layer or multi-layer structure.

The gate G1 of the transistor TR may be disposed on the first insulating layer 10. The gate G1 may be a portion of a metal pattern. The gate G1 may overlap the channel area AC1. The gate G1 may be used as a mask in a process of doping the semiconductor pattern.

A second insulating layer 20 may be disposed on the first insulating layer 10 and may cover the gate G1. The second insulating layer 20 may overlap the pixels. The second insulating layer 20 may be/include an inorganic layer and/or an organic layer and may have a single-layer or multi-layer structure. The second insulating layer 20 may include at least one of silicon oxide, silicon nitride, and silicon oxynitride. The second insulating layer 20 may have a multi-layer structure of a silicon oxide layer and a silicon nitride layer.

A third insulating layer 30 may be disposed on the second insulating layer 20. The third insulating layer 30 may have a single-layer structure or a multi-layer structure. The third insulating layer 30 may have the multi-layer structure of a silicon oxide layer and a silicon nitride layer.

A first connection electrode CNE1 may be disposed on the third insulating layer 30. The first connection electrode CNE1 may be connected to the connection signal line SCL via a contact hole CNT1 in the first, second, and third insulating layers 10, 20, and 30.

A fourth insulating layer 40 may be disposed on the third insulating layer 30. The fourth insulating layer 40 may have a single-layer structure of a silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 via a contact hole CNT2 in the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer.

The light emitting element layer 130 may be disposed on the circuit layer 120. The light emitting element layer 130 may include the light emitting element ED. The light emitting element layer 130 may include an organic light emitting material, an inorganic light emitting material, a quantum dot, a quantum rod, a micro-LED, or a nano-LED.

The light emitting element ED may include a first electrode AE, a light emitting layer EL, and a second electrode CE. The first electrode AE may be disposed on the sixth insulating layer 60. The first electrode AE may be connected to the second connection electrode CNE2 via a contact hole CNT3 in the sixth insulating layer 60.

A pixel definition layer 70 may be disposed on the sixth insulating layer 60 and may cover a portion of the first electrode AE. An opening 70-OP may be in the pixel definition layer 70. At least a portion of the first electrode AE may be exposed through the opening 70-OP of the pixel definition layer 70.

The active area AA1 (refer to FIG. 1) may include a light emitting area PXA and a non-light-emitting area NPXA adjacent to the light emitting area PXA. The non-light-emitting area NPXA may surround the light emitting area PXA. The light emitting area PXA may correspond to a portion of the first electrode AE exposed through the opening 70-OP.

The light emitting layer EL may be disposed on the first electrode AE. The light emitting layer EL may be partially disposed in the opening 70-OP. The light emitting layer EL may be formed in each of the pixels. In each of the pixels, the corresponding portion of the light emitting layers EL may emit a light having at least one of blue, red, and green colors. In each of the pixels, the corresponding portion of the light emitting layer EL may provide a blue light or a white light.

The second electrode CE may be disposed on the light emitting layer EL. The second electrode CE may have an integral shape and may be disposed over the pixels.

Although not shown in figures, a hole control layer may be disposed between the first electrode AE and the light emitting layer EL. The hole control layer may be disposed in the light emitting area PXA and the non-light-emitting area NPXA. The hole control layer may include a hole transport layer and may further include a hole injection layer. An electron control layer may be disposed between the light emitting layer EL and the second electrode CE. The electron control layer may include an electron transport layer and may further include an electron injection layer. The hole control layer and the electron control layer may be formed in the plural pixels using an open mask.

The encapsulation layer 140 may be disposed on the light emitting element layer 130. The encapsulation layer 140 may include an inorganic layer, an organic layer, and an inorganic layer that are sequentially stacked.

The inorganic layers may protect the light emitting element layer 130 from moisture and oxygen, and the organic layer may protect the light emitting element layer 130 from dust particles. Each of the inorganic layers may include a silicon nitride layer, a silicon oxynitride layer, a silicon oxide layer, a titanium oxide layer, or an aluminum oxide layer. The organic layer may include an acrylic-based organic layer.

The input sensor 200 may be formed on the display panel 100 through successive processes. The input sensor 200 may be disposed directly on the display panel 100. The input sensor 200 may be coupled with the display panel 100 by the adhesive layer.

The input sensor 200 may include a base insulating layer 210, a first conductive layer 220, a sensing insulating layer 230, a second conductive layer 240, and a cover insulating layer 250.

The base insulating layer 210 may be/include an inorganic layer that includes at least one of silicon nitride, silicon oxynitride, and silicon oxide. The base insulating layer 210 may be/include an organic layer that includes an epoxy-based resin, an acrylic-based resin, or an imide-based resin. The base insulating layer 210 may have a single-layer structure or a multi-layer structure of layers stacked one on another in the third direction DR3.

Each of the first conductive layer 220 and the second conductive layer 240 may have a single-layer structure or a multi-layer structure of layers stacked in the third direction DR3.

The conductive layer having the single-layer structure may include a metal layer or a transparent conductive layer. The metal layer may include molybdenum, silver, titanium, copper, aluminum, or an alloy of some of the above metals. The transparent conductive layer may include a transparent conductive oxide, such as indium tin oxide (ITO), indium zinc oxide (IZO), zinc oxide (ZnO), indium zinc tin oxide (ITZO), or the like. The transparent conductive layer may include a conductive polymer such as PEDOT, a metal nanowire, a graphene, or the like.

The conductive layer having the multi-layer structure may include metal layers. The metal layers may have, for example, a three-layer structure of titanium-aluminum-titanium. The conductive layer having the multi-layer structure may include at least one metal layer and at least one transparent conductive layer.

At least one of the sensing insulating layer 230 and the cover insulating layer 250 may include an inorganic layer. The inorganic layer may include at least one of aluminum oxide, titanium oxide, silicon oxide, silicon nitride, silicon oxynitride, zirconium oxide, and hafnium oxide.

At least one of the sensing insulating layer 230 and the cover insulating layer 250 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

Figure 6:
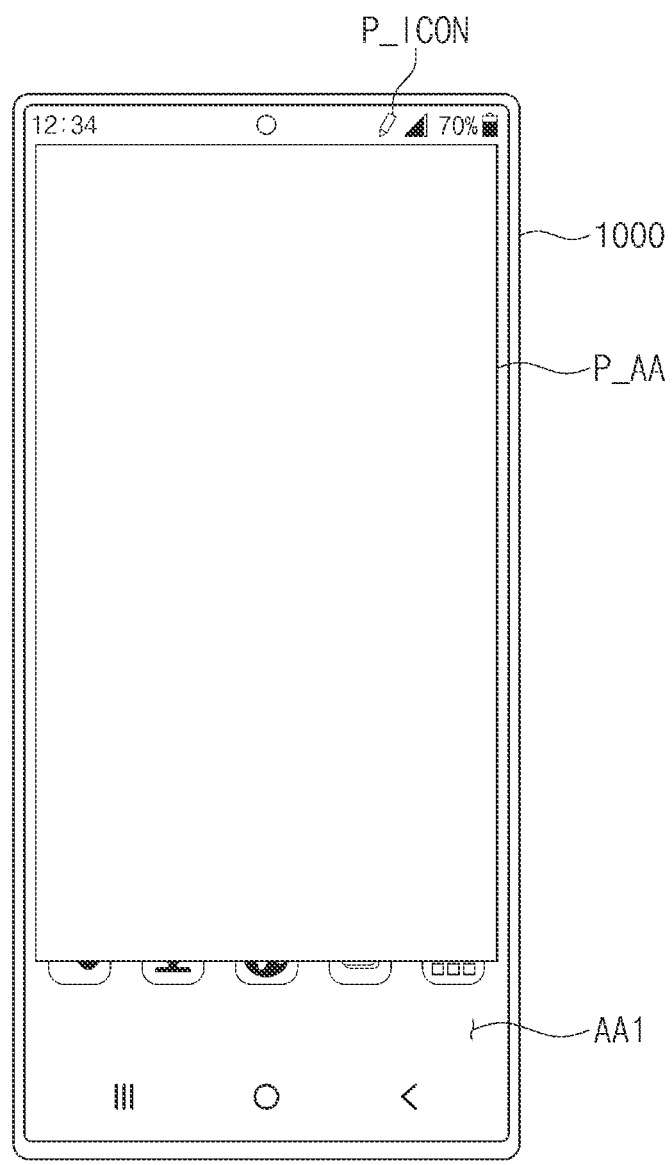
FIG. 6 is a plan view showing an electronic device operating in a first mode according to an embodiment.
Figure 7:
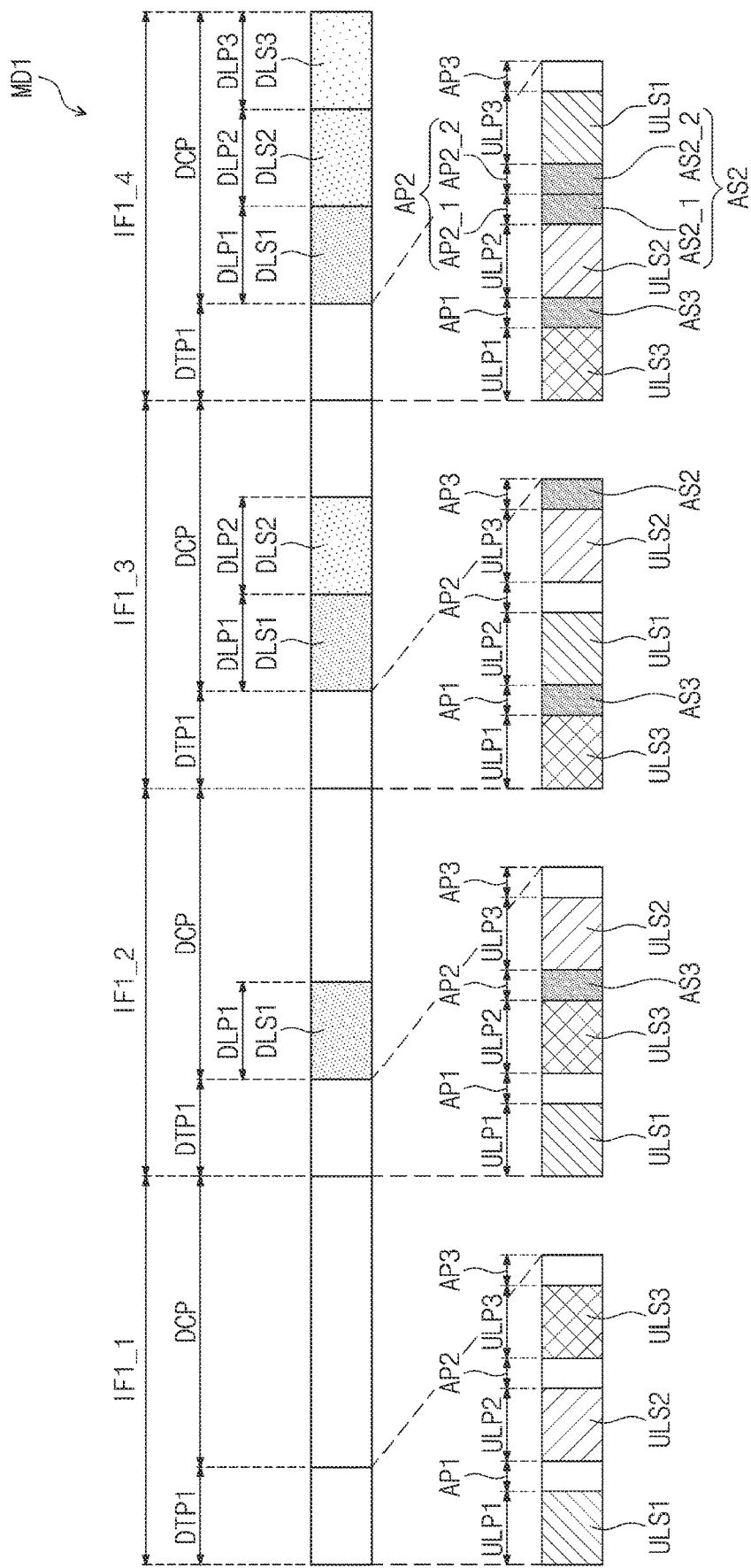
FIG. 7 is a conceptual diagram showing an operation of an electronic device in a first mode according to an embodiment.
Figure 8A:
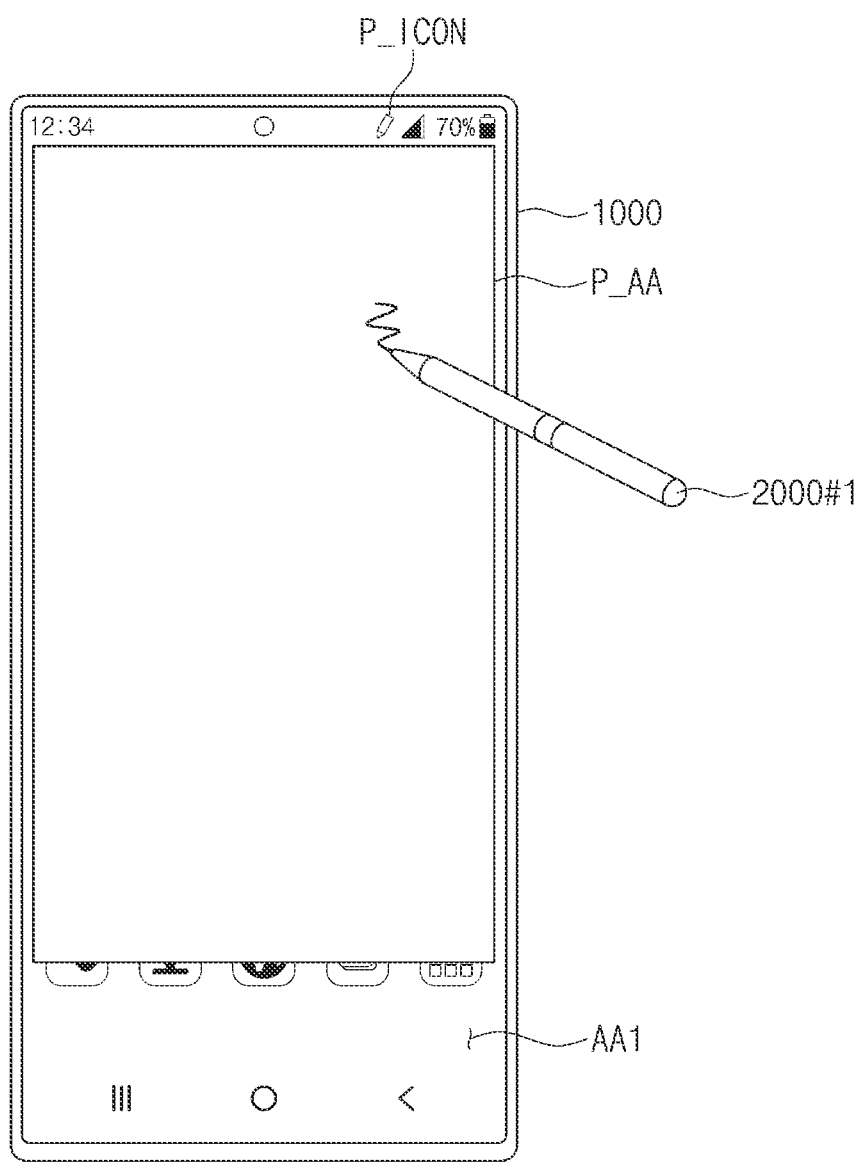
FIG. 8A is a view showing a first input in a first mode according to an embodiment.
Figure 8B:
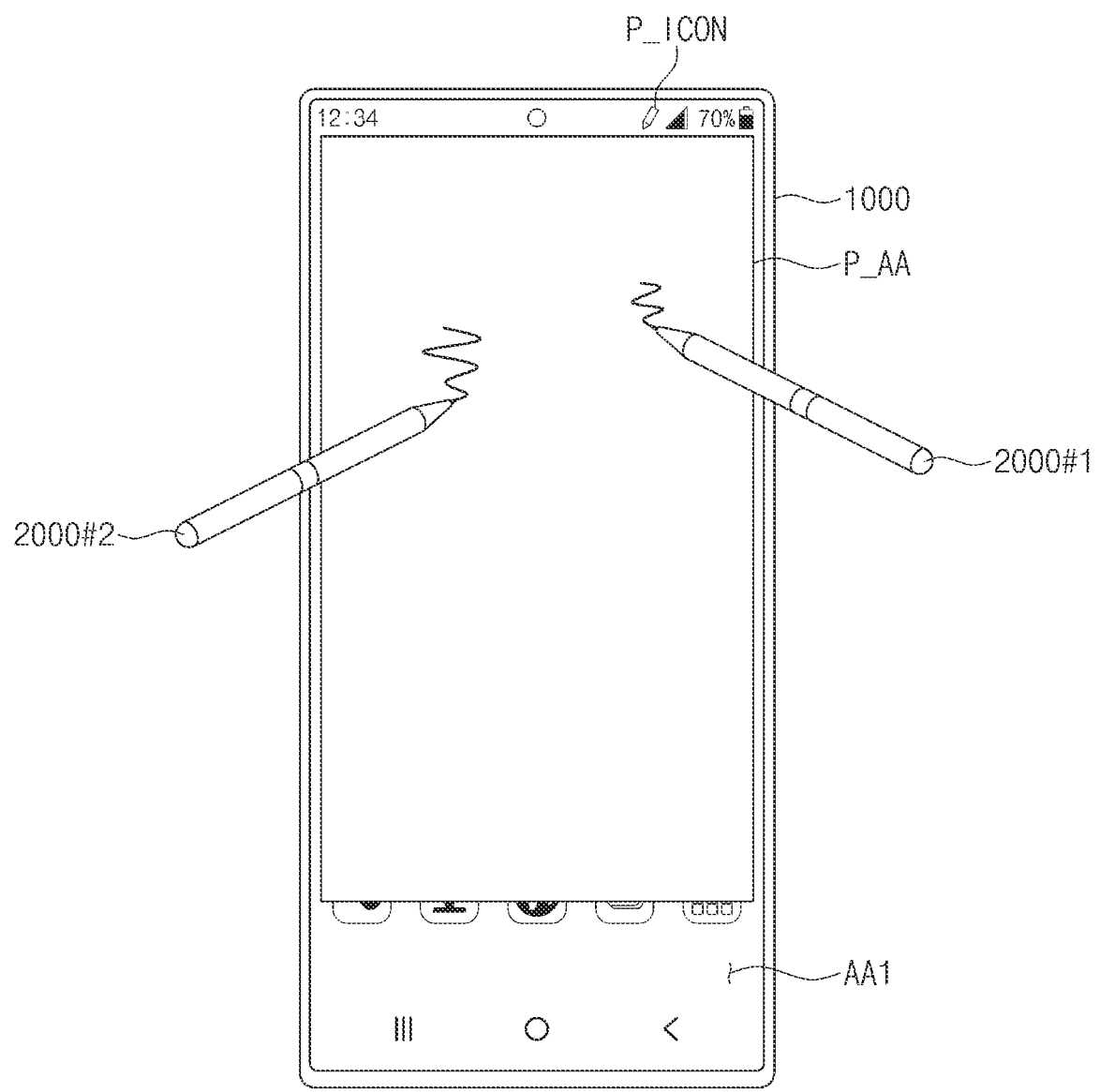
FIG. 8B is a view showing a first input in a first mode according to an embodiment.
Figure 8C:
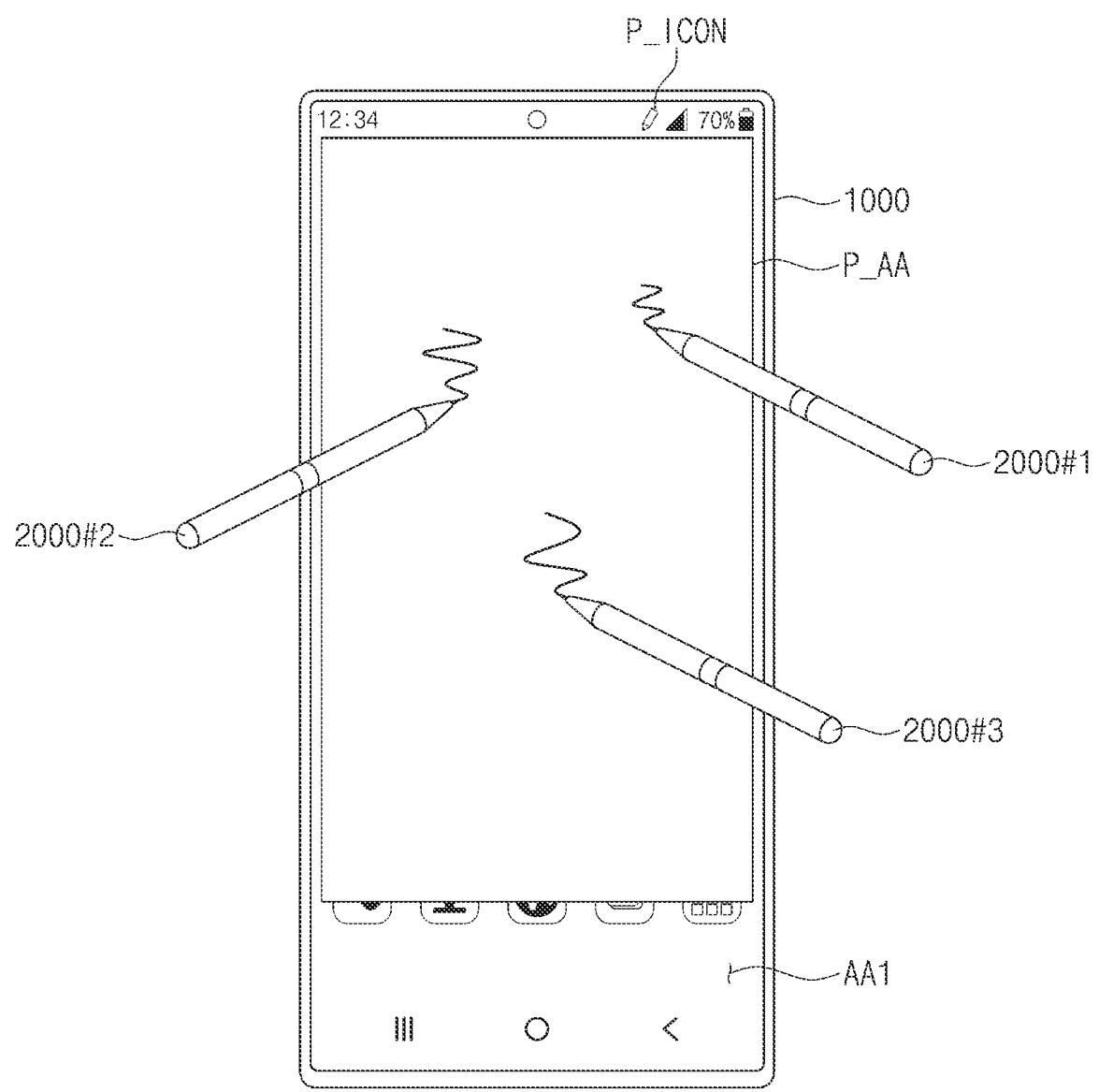
FIG. 8C is a view showing a first input in a first mode according to an embodiment.

FIG. 6 is a plan view showing the electronic device 1000 operating in the first mode MD1 according to an embodiment. FIG. 7 is a conceptual diagram showing an operation in the first mode according to an embodiment. FIGS. 8A, 8B, and 8C are views showing that a first input is sensed in the first mode according to one or more embodiments.

Referring to FIGS. 3, 6, and 7, the sensor controller 200C may operate in the first mode MD1 (in which a first input generated by the input device 2000 is sensed) or the second mode (in which a second input generated by the user's body 3000 is sensed).

The user may select to enter the first mode MD1 using the user interface. When the user selects the first mode MD1, a pen icon P_ICON may be displayed in the active area AA1 (refer to FIG. 1) of the electronic device 1000, and in this case, the sensor controller 200C may operate in the first mode MD1. A pen recognition area P_AA may be displayed in the active area AA1 of the electronic device 1000 in the first mode MD1.

When the first mode MD1 is activated, the sensor controller 200C may operate to sense a first input. In the first mode MD1, the sensor controller 200C may sense the first input in the unit of a first input sensing frame. The first input sensing frame in the first mode MD1 may be referred to as a pen sensing frame. FIG. 7 shows four pen sensing frames IF1_1, IF1_2, IF1_3, and IF1_4, for example.

Lengths (or widths) of the four pen sensing frames IF1_1 to IF1_4 may be equal to each other. The sensor controller 200C may operate at a frequency in a range of about 60 Hz to about 480 Hz. When the sensor controller 200C operates at the frequency of about 60 Hz, each of the pen sensing frames IF1_1 to IF1_4 may have a length/width of about 16.66 ms. When the sensor controller 200C operates at the frequency of about 240 Hz, each of the pen sensing frames IF1_1 to IF1_4 may have a length/width of about 4.16 ms. The sensor controller 200C may operate at one or more frequencies other than about 60 Hz and about 240 Hz.

Each of the pen sensing frames IF1_1 to IF1_4 may include a first search period DTP1 and a communication period DCP. The communication period DCP may follow the first search period DTP1. During the first search period DTP1, the sensor controller 200C may transmit a plurality of search signals to the input sensor 200. The search signals may include two or more search signals that are able to be communicated through two or more different protocols, respectively. As an example, the search signals may include three search signals that are able to be communicated through three protocols, respectively. The three search signals may be referred to as a first search signal ULS1, a second search signal ULS2, and a third search signal ULS3, respectively. Each of the first to third search signals ULS1 to ULS3 may be an upward search signal transmitted to the input device 2000 from the electronic device 1000 via the input sensor 200.

The first search signal ULS1 may be communicated through a first protocol, the second search signal ULS2 may be communicated through a second protocol, and the third search signal ULS3 may be communicated through a third protocol. The first to third protocols may be different from each other. For example, the first protocol may be a Microsoft Pen Protocol (MPP), the second protocol may be a Wacom Active ElectroStatic (AES) protocol, and the third protocol may be a Universal Stylus Initiative (USI) pen protocol. FIG. 7 shows three search signals. The search signals may further include signals that may be communicated through another protocol other than the above-mentioned protocols. The first to third search signals ULS1 to ULS3 may have frequencies that are different from each other, may have voltages that are different from each other, or may have wavelengths that are different from each other.

The first search period DTP1 may include a first uplink period ULP1, a second uplink period ULP2, and a third uplink period ULP3. The first to third uplink periods ULP1 to ULP3 may be arranged sequentially on the time axis and do not overlap each other on the time axis. The second uplink period ULP2 may be after the first uplink period ULP1 has terminated/ended, and the third uplink period ULP3 may be after the second uplink period ULP2 has terminated/ended.

During the first search period DTP1, the electronic device 1000 may output the first to third search signals ULS1 to ULS3. The sensor controller 200C may determine a priority/sequence of the first to third search signals ULS1 to ULS3 and may output the first to third search signals ULS1 to ULS3 according to the priority/sequence.

As an example, the sensor controller 200C may output the first search signal ULS1 during the first uplink period ULP1 of a first pen sensing frame IF1_1, may output the second search signal ULS2 during the second uplink period ULP2 of the first pen sensing frame IF1_1, and may output the third search signal ULS3 during the third uplink period ULP3 of the first pen sensing frame IF1_1. The priority/sequence of the first to third search signals ULS1 to ULS3 may be changed in the unit of at least one pen sensing frame.

The first search period DTP1 may further include a response period. The response period may include a first response period AP1, a second response period AP2, and a third response period AP3. The first response period AP1 may be disposed between the first uplink period ULP1 and the second uplink period ULP2. The first response period AP1 may start (immediately) after/at an end time/point of the first uplink period ULP1 and may end (immediately) before/at a start time/point of the second uplink period ULP2. The second response period AP2 may be disposed between the second uplink period ULP2 and the third uplink period ULP3. The second response period AP2 may start (immediately) after/at an end time/point of the second uplink period ULP2 and may end (immediately) before/at a start time/point of the third uplink period ULP3. The third response period AP3 may be disposed between the third uplink period ULP3 and the communication period DCP. The third response period AP3 may start (immediately) after/at an end time/point of the third uplink period ULP3 and may end (immediately) before/at a start time/point of the communication period DCP. The first to third response periods AP1 to AP3 may not overlap each other on the time axis and may not significantly overlap the first to third uplink periods ULP1 to ULP3 on the time axis.

During the first response period AP1, the sensor controller 200C may receive a response signal corresponding to the search signal output in the first uplink period ULP1 or may wait for the response signal to be received. During the second response period AP2, the sensor controller 200C may receive a response signal corresponding to the search signal output in the second uplink period ULP2 or may wait for the response signal to be received. During the third response period AP3, the sensor controller 200C may receive a response signal corresponding to the search signal output in the third uplink period ULP3 or may wait for the response signal to be received. The response signal corresponding to the first search signal ULS1 may be referred to as a first response signal, the response signal corresponding to the second search signal ULS2 may be referred to as a second response signal AS2, and the response signal corresponding to the third search signal ULS3 may be referred to as a third response signal AS3.

In the first pen sensing frame IF1_1, the sensor controller 200C may not receive the response signal corresponding to the first to third search signals ULS1 to ULS3. In this case, no data communication between the input device 2000 and the sensor controller 200C may be performed in the communication period DCP of the first pen sensing frame IF1_1.

The sensor controller 200C may output the first search signal ULS1 during the first uplink period ULP1 of a second pen sensing frame IF1_2, may output the third search signal ULS3 during the second uplink period ULP2 of the second pen sensing frame IF1_2, and may output the second search signal ULS2 during the third uplink period ULP3 of the second pen sensing frame IF1_2. Different from the first pen sensing frame IF1_1, the third search signal ULS3 may be outputted prior to the second search signal ULS2 in the second pen sensing frame IF1_2.

Referring to FIGS. 7 and 8A, a first input device 2000#1, which supports the third protocol, may access/approach the electronic device 1000 in the second pen sensing frame IF1_2. In this case, the sensor controller 200C may receive the third response signal AS3 corresponding to the third search signal ULS3 from the first input device 2000#1 during the second response period AP2. Accordingly, during the communication period DCP of the second pen sensing frame IF1_2, the electronic device 1000 may perform data communication with the first input device 2000#1.

During the communication period DCP, the sensor controller 200C may receive a first downlink signal DLS1 provided from the first input device 2000#1 through the input sensor 200. The first downlink signal DLS1 may be communicated through the third protocol. The communication period DCP may include a first downlink period DLP1 during which the first downlink signal DLS1 is received. The sensor controller 200C may sense a first input of the first input device 2000#1 based on the first downlink signal DLS1. The first downlink period DLP1 may be shorter than the communication period DCP.

Given that, in the second pen sensing frame IF1_2, the sensor controller 200C has received the third response signal AS3 corresponding to the third search signal ULS3 (and has performed the data communication with the first input device 2000#1), the priority/sequence of the first to third search signals ULS1 to ULS3 may be updated. An output order/sequence of the first to third search signals ULS1 to ULS3 may be changed so that the third search signal ULS3 is outputted prior to the first and second search signals ULS1 and ULS2.

Referring to FIGS. 7 and 8B, the sensor controller 200C may output the third search signal ULS3 during the first uplink period ULP1 of a third pen sensing frame IF1_3, may output the first search signal ULS1 during the second uplink period ULP2 of the third pen input sensing frame IF1_3, and may output the second search signal ULS2 during the third uplink period ULP3 of the third pen sensing frame IF1_3. Different from the second pen sensing frame IF1_2, the third search signal ULS3 may be outputted prior to the first and second search signals ULS1 and ULS2 in the third pen sensing frame IF1_3.

In the third pen sensing frame IF1_3, the first input device 2000#1 supporting the third protocol and a second input device 2000#2 supporting the second protocol may access the electronic device 1000. The sensor controller 200C may receive a third response signal AS3 corresponding to the third search signal ULS3 from the first input device 2000#1 during the first response period AP1. The sensor controller 200C may receive a second response signal AS2 corresponding to the second search signal ULS2 from the second input device 2000#2 during the third response period AP3. Accordingly, the electronic device 1000 may perform data communication with the first and second input devices 2000#1 and 2000#2 during the communication period DCP of the third pen sensing frame IF1_3.

During the communication period DCP, the sensor controller 200C may receive the first downlink signal DLS1 provided from the first input device 2000#1 through the input sensor 200 and may receive a second downlink signal DLS2 from the second input device 2000#2 through the input sensor 200. The first downlink signal DLS1 may be communicated through the third protocol, and the second downlink signal DLS2 may be communicated through the second protocol. The communication period DCP may include the first downlink period DLP1 during which the first downlink signal DLS1 is received and may include a second downlink period DLP2 during which the second downlink signal DLS2 is received. The sensor controller 200C may sense a first input of the first input device 2000#1 based on the first downlink signal DLS1 and may sense a first input of the second input device 2000#2 based on the second downlink signal DLS2. Each of the downlink periods DLP1 and DLP2 may be shorter than the communication period DCP. The first and second downlink periods DLP1 and DLP2 may not significantly overlap each other on the time axis. The second downlink period DLP2 may start after the first downlink period DLP1 has terminated/ended.

Given that, in the third pen sensing frame IF1_3, the sensor controller 200C has performed data communication with the input devices 2000#1 and 2000#2, the priority/sequence of the first to third search signals ULS1 to ULS3 may be updated, so that the second and third search signals ULS2 and ULS3 are outputted prior to the first search signal ULS1.

Referring to FIGS. 7 and 8C, the sensor controller 200C may output a third search signal ULS3 during the first uplink period ULP1 of a fourth pen sensing frame IF1_4, may output a second search signal ULS2 during the second uplink period DLP2 of the fourth pen sensing frame IF1_4, and may output a first search signal ULS1 during the third uplink period ULP3 of the fourth pen sensing frame IF1_4. Different from the third pen sensing frame IF1_3, the second search signal ULS2 may be outputted prior to the first search signal ULS1 in the fourth pen sensing frame IF1_4.

In the fourth pen sensing frame IF1_4, the first input device 2000#1 supporting the third protocol, the second input device 2000#2 supporting the second protocol, and a third input device 2000#3 supporting the second protocol may access the electronic device 1000. The sensor controller 200C may receive a third response signal AS3 corresponding to the third search signal ULS3 from the first input device 2000#1 during the first response period AP1. The sensor controller 200C may receive second response signals AS2 corresponding to the second search signal DLS2 from the second and third input devices 2000#2 and 2000#3 during the second response period AP2.

When/if there are two input devices supporting the second protocol, the second response period AP2 may include two response sub-periods, referred to as a first response sub-period AP2_1 and a second response sub-period AP2_2. During the first response sub-period AP2_1, the sensor controller 200C may receive a first sub-response signal AS2_1 from the second input device 2000#2. During the second response sub-period AP2_2, the sensor controller 200C may receive a second sub-response signal AS2_2 from the third input device 2000#3. The electronic device 1000 may perform data communication with the input devices 2000#1, 2000#2, and 2000#3 during the communication period DCP of the fourth pen sensing frame IF1_4.

During the communication period DCP of the fourth pen sensing frame IF1_4, the sensor controller 200C may receive a first downlink signal DLS1 provided from the first input device 2000#1 through the input sensor 200, may receive a second downlink signal DLS2 from the second input device 2000#2 through the input sensor 200, and may receive a third downlink signal DLS3 from the third input device 2000#3 through the input sensor 200. The first downlink signal DLS1 may be communicated through the third protocol, and each of the second and third downlink signals DLS2 and DLS3 may be communicated through the second protocol.

The communication period DCP may include a first downlink period DLP1 during which the first downlink signal DLS1 is received, may include a second downlink period DLP2 during which the second downlink signal DLS2 is received, and may include a third downlink period DLP3 during which the third downlink signal DLS3 is received. The sensor controller 200C may sense a first input of the first input device 2000#1 based on the first downlink signal DLS1, may sense a first input of the second input device 2000#2 based on the second downlink signal DLS2, and may sense a first input of the third input device 2000#3 based on the third downlink signal DLS3.

Each of the downlink periods DLP1, DLP2, and DLP3 may be shorter than the communication period DCP. The downlink periods DLP1, DLP2, and DLP3 may not (significantly) overlap each other on the time axis. The second downlink period DLP2 may start (immediately) after the first downlink period DLP1 has terminated/ended, and the third downlink period DLP3 may start (immediately) after the second downlink period DLP2 has terminated/ended.

The electronic device 1000 may output search signals ULS1 to ILS3 that are able to be communicated through different protocols during the first search period DTP1 of each of the pen sensing frames IF1_1 to IF1_4; thus, the electronic device 1000 may sense the access of various types of input devices 2000#1 to 2000#3. Advantageously, the electronic device 1000 may support multiple protocols to enable data communication with various types of input devices 2000#1 to 2000#3.

Referring to FIG. 7, the sensor controller 200C transmits the search signals to the input sensor 200 during the first search period DTP1. The sensor controller 200C may receive a downward search signal transmitted through the input sensor 200 during a portion of the first search period DTP1. In this case, the downward search signal may be a search signal transmitted to the electronic device 1000 by one of the input devices 2000#1 to 2000#3. The first search period DTP1 may further include a waiting period to receive the downward search signal. The waiting period may not (significantly) overlap the uplink periods ULP1 to DLP3 on the time axis.

Figure 9:
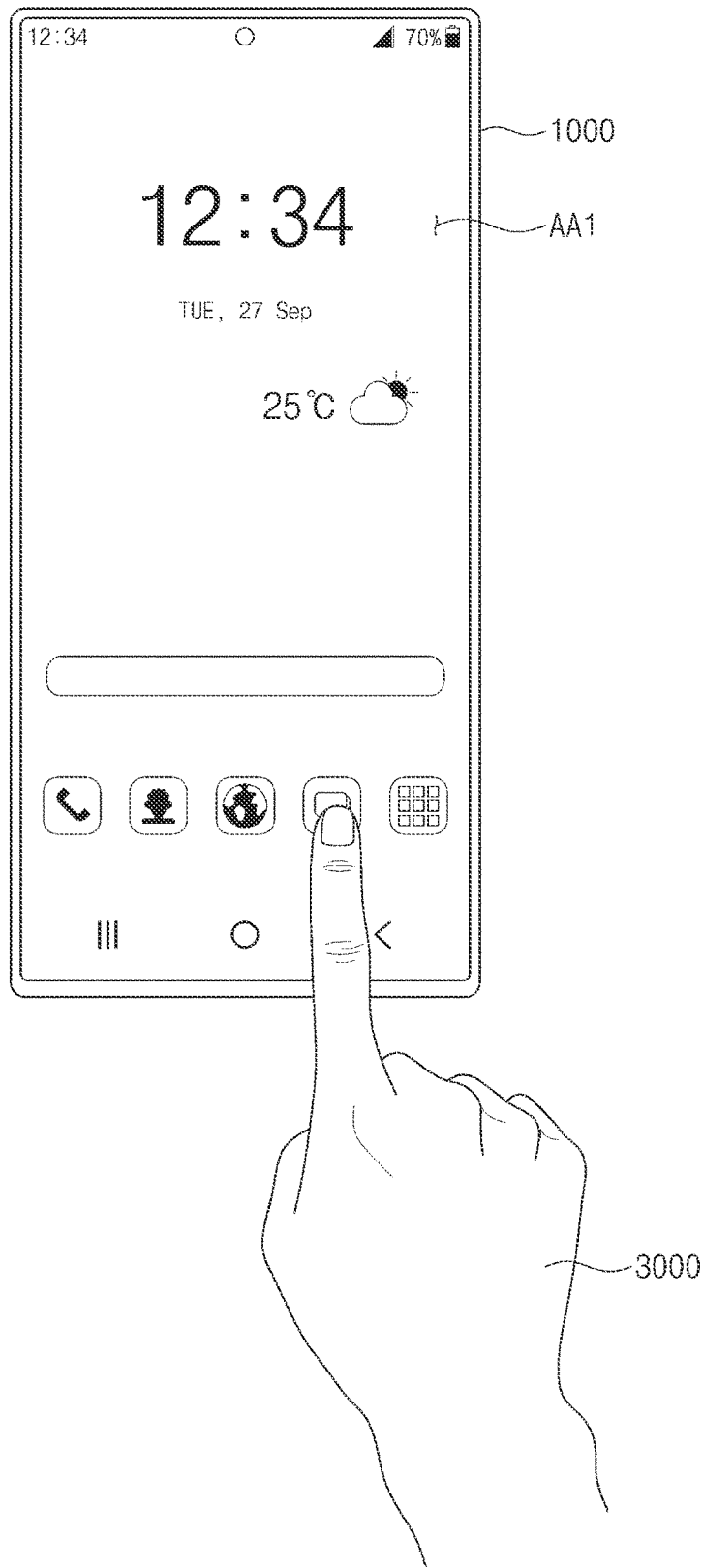
FIG. 9 is a view showing an electronic device operating in a second mode according to an embodiment.
Figure 10:
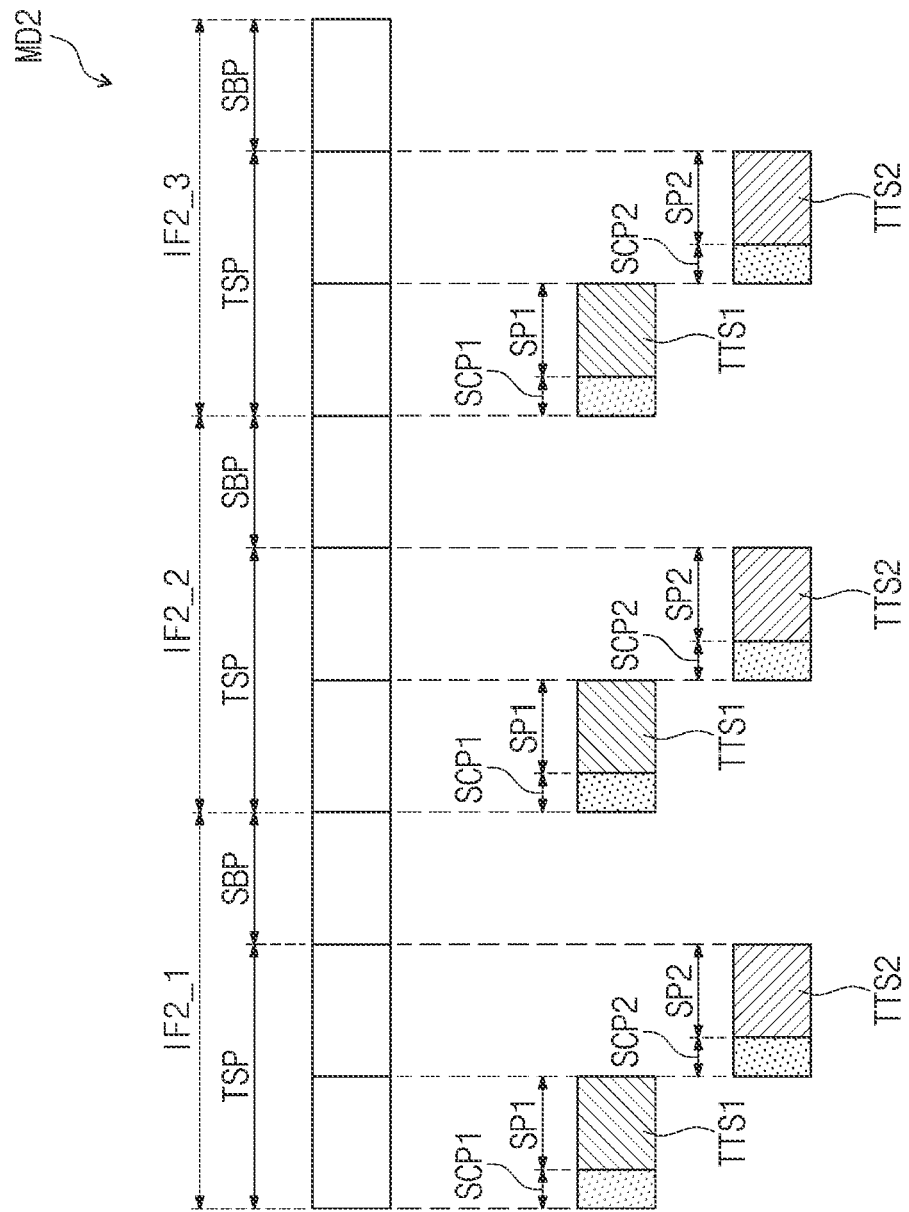
FIG. 10 is a conceptual diagram showing an operation of an electronic device in a second mode according to an embodiment.
Figure 11A:
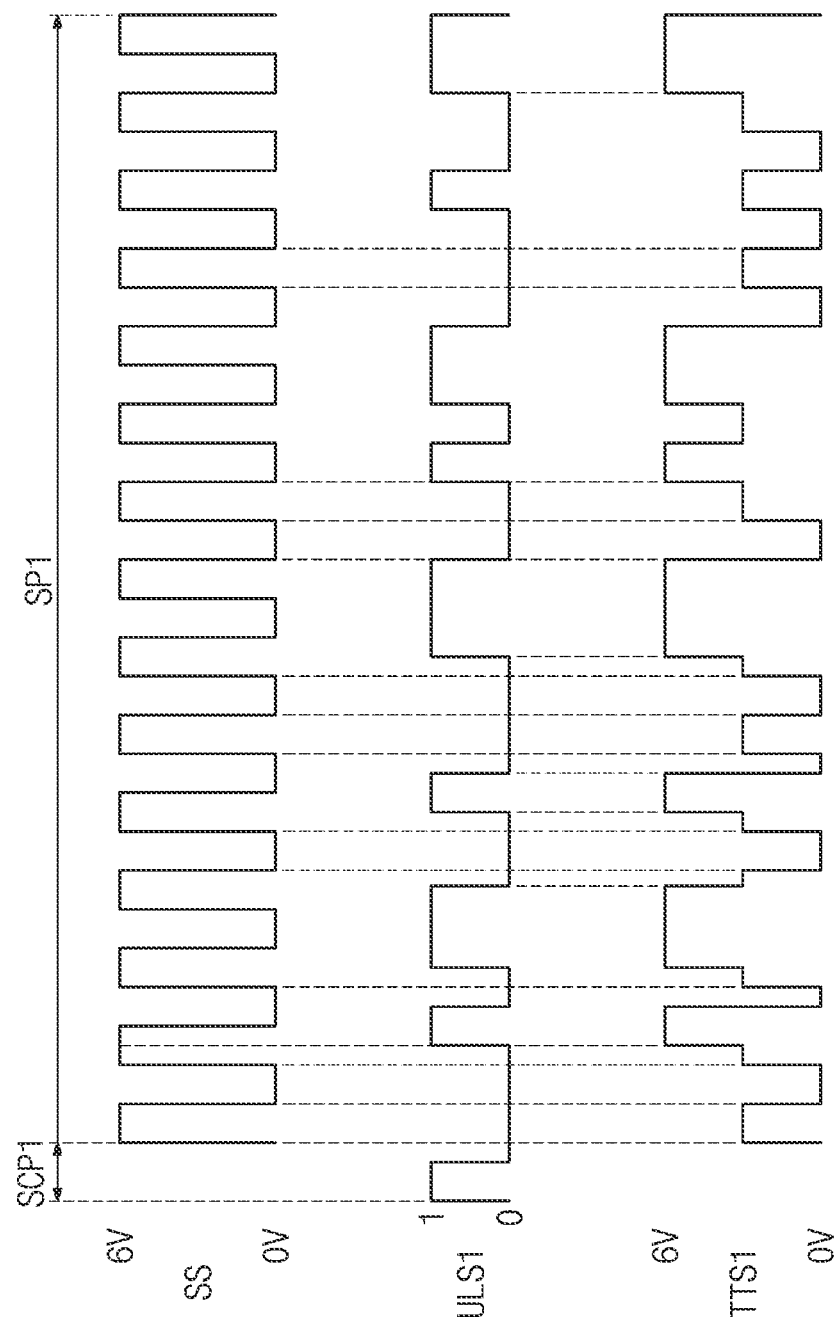
FIG. 11A illustrates waveform diagrams showing a first integrated sensing signal according to an embodiment.
Figure 11B:
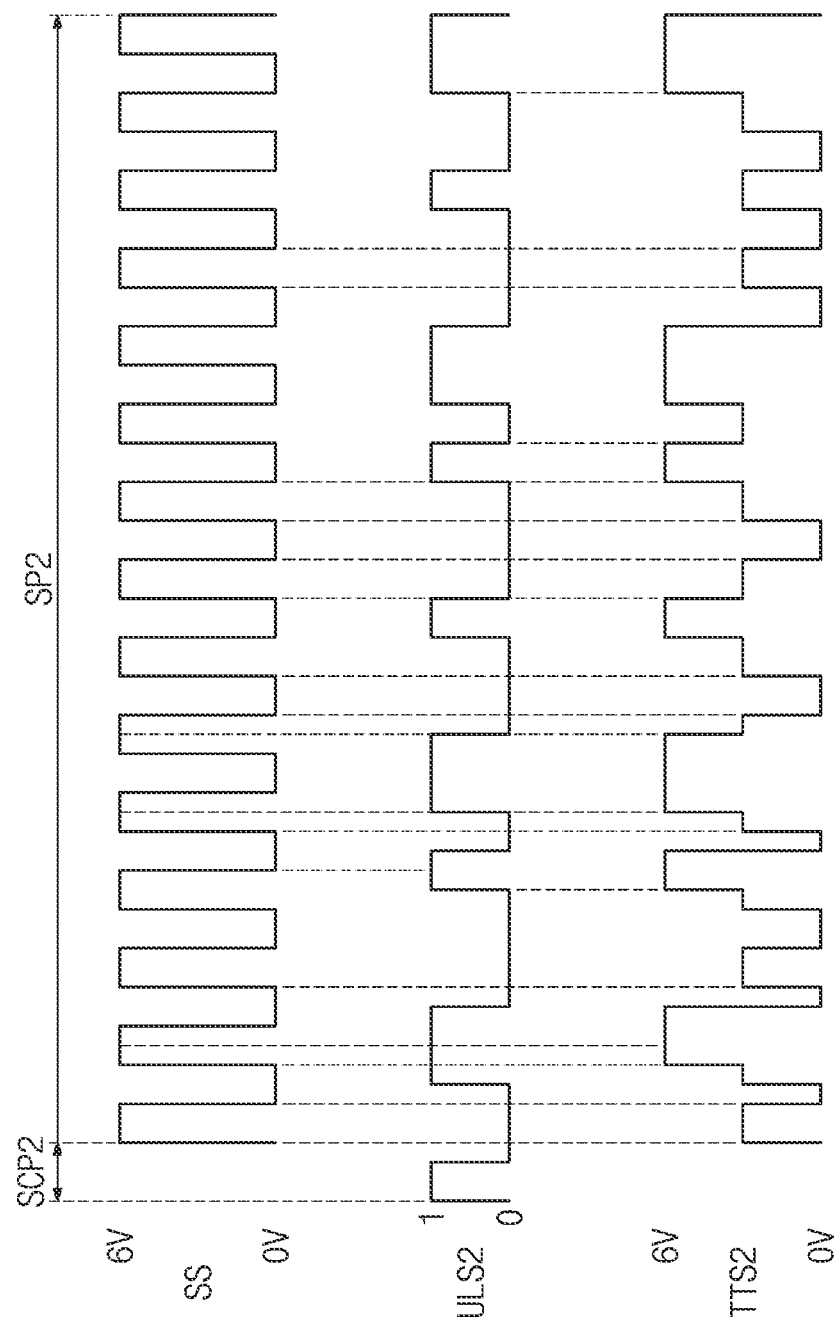
FIG. 11B illustrates waveform diagrams showing a second integrated sensing signal according to an embodiment.

FIG. 9 is a plan view showing the electronic device 1000 operating in the second mode MD2 according to an embodiment. FIG. 10 is a conceptual diagram showing an operation of the electronic device 1000 in the second mode according to an embodiment. FIGS. 11A and 11B are waveform diagrams showing first and second integrated sensing signals according to one or more embodiments.

Referring to FIGS. 3, 9, 10, 11A, and 11B, the sensor controller 200C may operate in the second mode MD2 after the first mode MD1 (refer to FIG. 7) has terminated.

When the second mode MD2 is activated, the sensor controller 200C may operate to sense a second input in the second mode MD2. The second input may be a touch input generated by the user's body 3000, e.g., a finger. In the second mode MD2, the sensor controller 200C may sense the second input in the unit of a second input sensing frame. The second input sensing frame in the second mode MD2 may be referred to as a finger sensing frame. FIG. 10 shows three finger sensing frames IF2_1, IF2_2, and IF2_3.

Lengths of the three finger sensing frames IF2_1 to IF2_3 may be equal to each other. The sensor controller 200C may operate at a frequency in a range from about 60 Hz to about 480 Hz. When/if the sensor controller 200C operates at the frequency of about 60 Hz, each of the finger sensing frames IF2_1 to IF2_3 may have a length of about 16.66 ms. When/if the sensor controller 200C is operated at the frequency of about 240 Hz, each of the finger sensing frames IF2_1 to IF2_3 may have a length of about 4.16 ms. The sensor controller 200c may operate at one or more frequencies other than 60 Hz and 240 Hz.

Each of the finger sensing frames IF2_1 to IF2_3 may include an integrated sensing period TSP. During the integrated sensing period TSP, the sensor controller 200C may transmit an integrated signal to the input sensor 200. The integrated signal may include a signal obtained by integrating at least one of several search signals with a sensing signal. The search signals may be two or more search signals that are able to be communicated through two or more different protocols, respectively. The search signals may include first, second, and third search signals that are able to be communicated through three different protocols, respectively. Each of first and second search signals ULS1 and ULS2 may be an upward search signal transmitted to the input device 2000 from the electronic device 1000 through the input sensor 200, and a third search signal may be a downward search signal transmitted to the electronic device 1000 from the input device 2000.

The first search signal ULS1 may be communicated through the first protocol, the second search signal ULS2 may be communicated through the second protocol, and the third search signal may be communicated through the third protocol. The first to third protocols may be different from each other. For example, each of the first to third protocols may be one of a Microsoft Pen Protocol (MPP), a Wacom Active ElectroStatic (AES) protocol, and a Universal Stylus Initiative (USI) pen protocol. The search signals may include a search signal that is able to be communicated with a protocol other than the above-mentioned protocols.

The integrated signal may include a first integrated sensing signal TTS1 and a second integrated sensing signal TTS2. The first integrated sensing signal TTS1 may be (generated by the sensor controller 200C and) obtained by integrating characteristics (e.g., values and/or waveforms) of a first search signal ULS1 (among several types/categories of search signals) with characteristics (e.g., values and/or waveforms) of a sensing signal SS. The second integrated sensing signal TTS2 may be (generated by the sensor controller 200C and) obtained by integrating characteristics (e.g., values and/or waveforms) of a second search signal ULS2 (among the types/categories of search signals) with characteristics (e.g., values and/or waveforms) of a sensing signal SS. A sensing signal SS may be applied to the input sensor 200 to sense a second input generated by the user's body 3000 in the second mode. In the second mode, the input sensor 200 may operate in a self-capacitance operation mode or a mutual-capacitance operation mode. The sensing signal SS may be a self-capacitance sensing signal to allow the input sensor 200 to operate in the self-capacitance operation mode.

The integrated sensing period TSP may include a first sensing period SP1 and a second sensing period SP2. During the first sensing period SP1, the sensor controller 200C may transmit the first integrated sensing signal TTS1 to the input sensor 200; during the second sensing period SP2, the sensor controller 200C may transmit the second integrated sensing signal TTS2 to the input sensor 200. The second sensing period SP2 may (immediately) follow the first sensing period SP1. The first sensing period SP1 and the second sensing period SP2 may not (significantly) overlap each other on the time axis.

During the first sensing period SP1, the sensor controller 200C may transmit the first integrated sensing signal TTS1 to the input sensor 200 to search for an input device 2000 supporting the first protocol and to substantially simultaneously sense a second input. During the second sensing period SP2, the sensor controller 200C may transmit the second integrated sensing signal TTS2 to the input sensor 200 to search for an input device 2000 supporting the second protocol and to substantially simultaneously sense a second input. That is, during one finger sensing frame period, the input sensor 200 may operate in the self-capacitance operation mode two times and may search for the access of an input device 2000 supporting another protocol.

The number of the sensing periods included in the integrated sensing period TSP may be changed depending on the operation frequency of the sensor controller 200C. For example, when/if the operation frequency increases to about 360 Hz, 480 Hz, etc., the integrated sensing period TSP may include only one sensing period. In this case, the integrated sensing period TSP of a first finger sensing frame IF2_1 may include a first sensing period SP1, and the integrated sensing period TSP of a second finger sensing frame IF2_2 may include a second sensing period SP2. Accordingly, the sensor controller 200C may search for an input device 2000 supporting the first protocol while substantially simultaneously sensing a second input during the first sensing period SP1 of the first finger sensing frame IF2_1, and the sensor controller 200C may search for an input device 2000 supporting the second protocol while substantially simultaneously sensing a second input during the second sensing period SP2 of the second finger sensing frame IF2_2.

When/if the operation frequency of the sensor controller 200C decreases, the number of the sensing periods included in the integrated sensing period TSP may increase. For example, when/if the operation frequency of the sensor controller 200C is about 60 Hz, the integrated sensing period TSP may include three or four sensing periods.

The integrated sensing period TSP of each of the finger sensing frames IF2_1 to IF2_3 may further include a synchronization period. The integrated sensing period TSP may include a first synchronization period SCP1 preceding the first sensing period SP1 and may include a second synchronization period SCP2 preceding the second sensing period SP2. The second synchronization period SCP2 may be positioned between the first sensing period SP1 and the second sensing period SP2. During the first synchronization period SCP1, the sensor controller 200C may transmit the first search signal ULS1; during the second synchronization period SCP2, the sensor controller 200C may transmit the second search signal ULS2. The sensor controller 200C may use the first and second synchronization periods SCP1 and SCP2 to synchronize with the input device 2000 in response to the first search signal ULS1 or the second search signal ULS2. After the first and second synchronization periods SCP1 and SCP2, the sensor controller 200C may transmit the first integrated sensing signal TTS1 or the second integrated sensing signal TTS2 to the input sensor 200.

Each of the finger sensing frames IF2_1 to IF2_3 may further include a waiting period SBP. The waiting period SBP may be for the sensor controller 200C to wait for a third search signal to be received. The waiting period SBP may follow the integrated sensing period TSP.

As each of the finger sensing frames IF2_1 to IF2_3 includes the integrated sensing period TSP in the second mode MD2, the sensor controller 200C may periodically search for whether any of the input devices 2000#1 to 2000#3 (refer to FIGS. 8A to 8C) of various protocol types exists in the second mode MD2. Even when the sensor controller 200C is driven at a high speed, the access of various types of input devices may be sensed without deteriorating the sensing performance corresponding to the second input.

Referring to FIGS. 11A and 11B, the first integrated sensing signal TTS1 may be obtained by integrating the first search signal ULS1 and the sensing signal SS, and the second integrated sensing signal TTS2 may be obtained by integrating the second search signal ULS2 and the sensing signal SS. Each of the search signals ULS1 and ULS2 may be a digital signal represented by logic 0 and logic 1. The sensing signal SS may be an analog signal. The sensing signal SS may be a voltage signal that has values of about 0 V and about 6 V. Each of the first and second integrated sensing signals TTS1 and TTS2 may be a voltage signal that has values in the range of about 0 V and about 6 V.

When the first search signal ULS1 is 0 (zero), the first integrated sensing signal TTS1 may have substantially the same output waveform as that of the sensing signal SS and/or may have a fraction (e.g., ½) of the voltage level of the sensing signal SS. When the first search signal ULS1 is 1 (one), the first integrated sensing signal TTS1 may have substantially the high voltage level of the sensing signal SS (e.g., 6 V). The first integrated sensing signal TTS1 may have a rising edge when the first search signal ULS1 changes to 1 (one). The second integrated sensing signal TTS2 may be generated by a similar method.

The first and second integrated sensing signals TTS1 and TTS2 may be generated after being delayed by a predetermined time before the sensing signal SS starts. A period in which the first integrated sensing signal TTS1 is generated may be defined as the first sensing period SP1, and a delay period between the first integrated sensing signal TTS1 and the first search signal ULS1 may be defined as the first synchronization period SCP1. A period in which the second integrated sensing signal TTS2 is generated may be defined as the second sensing period SP2, and a delay period between the second integrated sensing signal TTS2 and the second search signal ULS2 may be defined as the second synchronization period SCP2. As the first and second search signals ULS1 and ULS2 are transmitted to the input sensor 200 during the first and second synchronization periods SCP1 and SCP2, the sensor controller 200C and the searched input device 2000 may be synchronized with each other by the first search signal ULS1 or the second search signal ULS2. The first integrated sensing signal TTS1 or the second integrated sensing signal TTS2 may be transmitted to the input sensor 200 after the synchronization periods SCP1 and SPC2.

The method of generating the first and second integrated sensing signals TTS1 and TTS2 may be configured according to particular embodiments. The voltage levels of the integrated sensing signals TTS1 and TTS2 may be configured according to particular embodiments.

Figure 12:
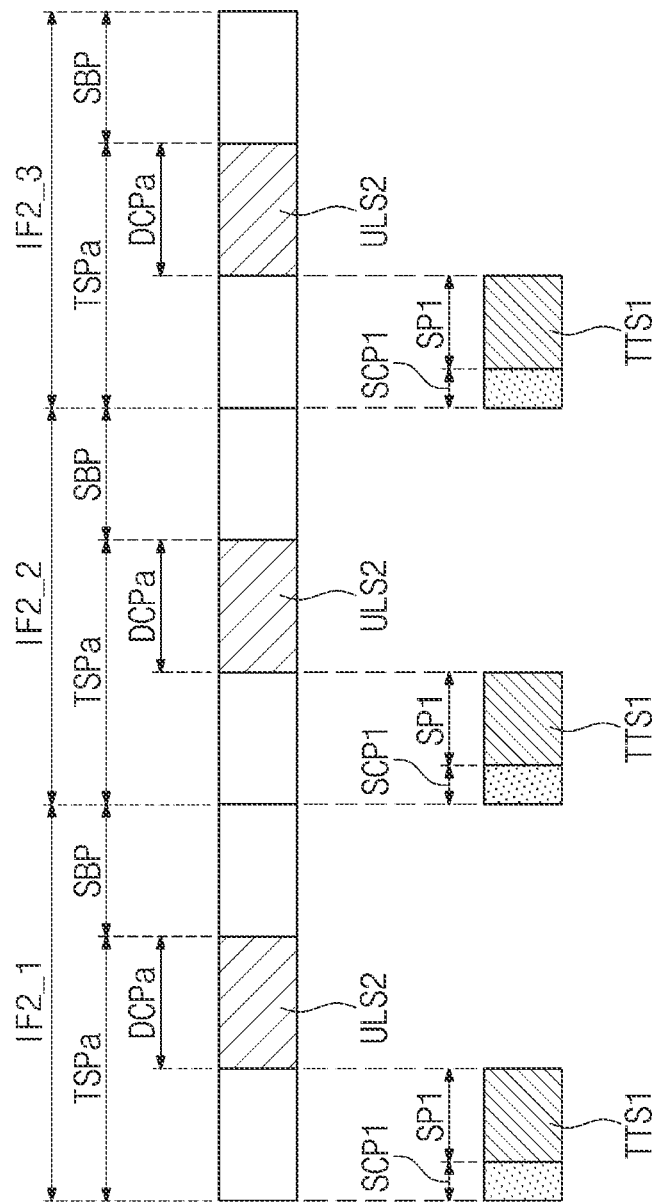
FIG. 12 is a conceptual diagram showing an operation of an electronic device in a second mode according to an embodiment.

FIG. 12 is a conceptual diagram showing an operation of an electronic device in the second mode according to an embodiment.

Referring to FIGS. 3 and 12, each of the finger sensing frames IF2_1, IF2_2, and IF2_3 may include an integrated sensing period TSPa. During the integrated sensing period TSPa, the sensor controller 200C may generate an integrated signal and may transmit the integrated signal to the input sensor 200. The integrated signal may include/be a signal obtained by integrating characteristics/features of one of the search signals and characteristics/features of the sensing signal. The integrated signals may include the first integrated sensing signal TTS1. The first integrated sensing signal TTS1 may be obtained by integrating characteristics of the first search signal ULS1 among the search signals and characteristics of the sensing signal SS (refer to FIG. 11A and FIG. 11B).

The integrated sensing period TSPa may include the first sensing period SP1. During the first sensing period SP1, the sensor controller 200C may transmit the first integrated sensing signal TTS1 to the input sensor 200. The integrated sensing period TSPa may further include a second search period DCPa. The search period DCPa may follow the first sensing period SP1. The first sensing period SP1 and the second search period DCPa may not (significantly) overlap each other on the time axis. During the second search period DCPa, the sensor controller 200C may transmit a second search signal ULS2 to the input sensor 200.

During the first sensing period SP1, the sensor controller 200C may transmit the first integrated sensing signal TTS1 to the input sensor 200 to search for an input device 2000 supporting the first protocol and to substantially simultaneously to sense a second input. During the second search period DCPa, the sensor controller 200C may transmit the second search signal ULS2 to the input sensor 200 to search for an input device 2000 supporting the second protocol. The sensor controller 200C may not sense any second input during the second search period DCPa. That is, during one finger sensing frame period IF2_1, IF2_2, or IF2_3, the input sensor 200 may operate in the self-capacitance operation mode only one time and may search for the access of (two) different input devices 2000 respectively supporting (two) different protocols.

The integrated sensing period TSPa of each of the finger sensing frames IF2_1 to IF2_3 may include a synchronization period. The integrated sensing period TSPa may include a first synchronization period SCP1 preceding the first sensing period SP1. During the first synchronization period SCP1, the sensor controller 200C may transmit the sensing signal SS to the input sensor 200. The first integrated sensing signal TTS1 may be transmitted to the input sensor 200 after the sensor controller 200C is synchronized with the input sensor 200 by the sensing signal SS.

Each of the finger sensing frames IF2_1 to IF2_3 may include the waiting period SBP. The waiting period SBP may be a period for the sensor controller 220c to wait for a third search signal to be received. The waiting period SBP may follow the integrated sensing period TSPa.

Figure 13:
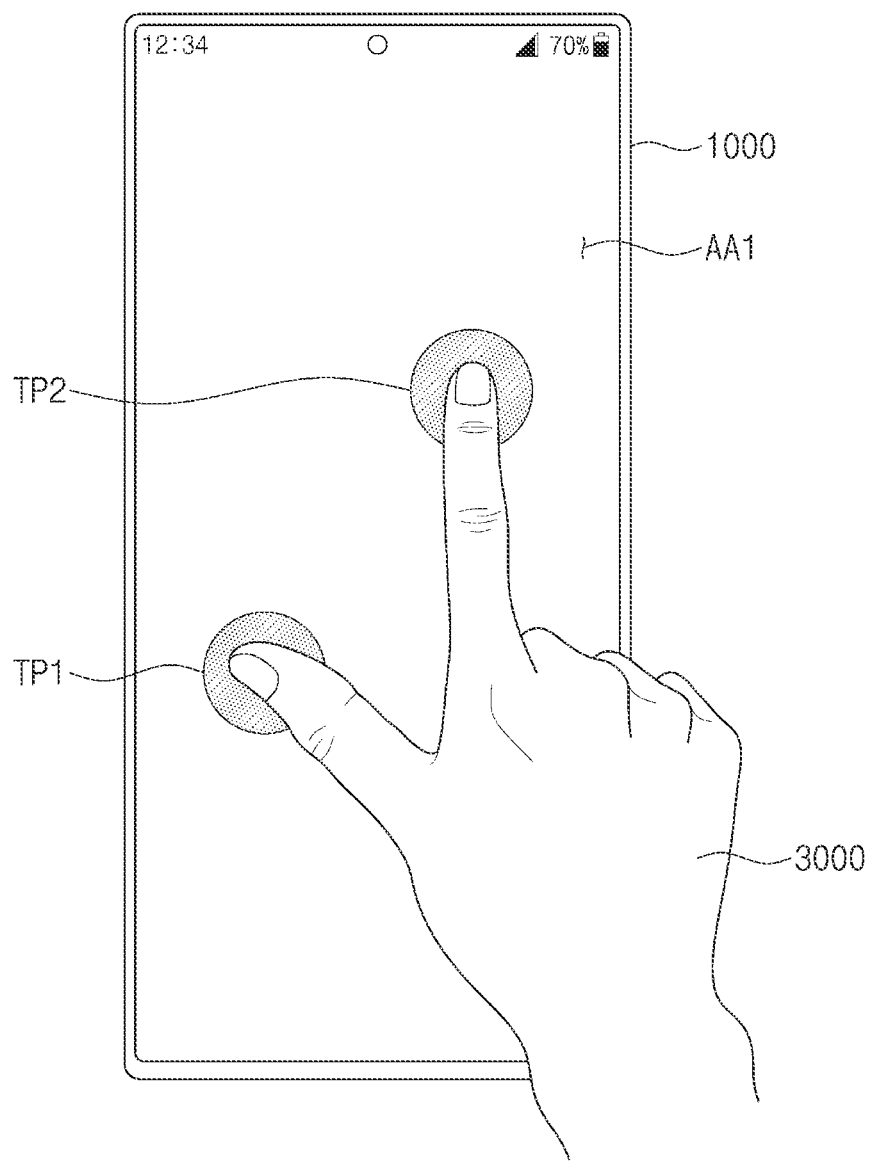
FIG. 13 is a view showing an electronic device operating in a second mode according to an embodiment.
Figure 14:
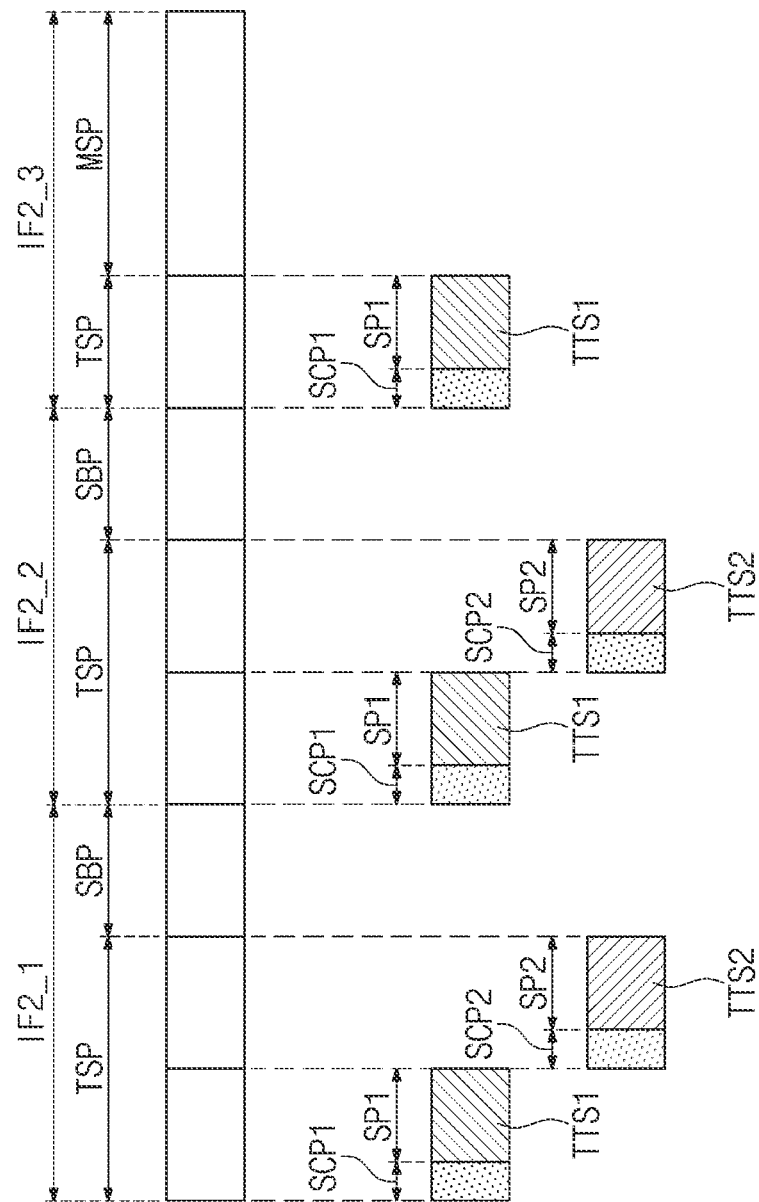
FIG. 14 is a conceptual diagram showing an operation of an electronic device in a second mode according to an embodiment.

FIG. 13 is a view showing an electronic device operating in a second mode according to an embodiment. FIG. 14 is a conceptual diagram showing an operation of the electronic device in the second mode according to an embodiment.

Referring to FIGS. 3, 13, and 14, when the second mode MD2 is activated, the sensor controller 200C may operate to sense a second input in the second mode MD2. The second input may be the touch input generated by the user's body 3000, e.g., the finger. Second inputs generated at two or more points may be defined as a multi-touch. FIG. 13 shows second inputs are generated at a first point TP1 and a second point TP2 as a multi-touch.

When a multi-touch is generated, the sensor controller 200C may control the input sensor 200 to operate in a mutual-capacitance operation mode. The integrated sensing period TSP of a third finger sensing frame IF2_3 may include the first sensing period SP1. During the first sensing period SP1, the input sensor 200 may operate in the self-capacitance operation mode. When/if second inputs are determined as a multi-touch in the self-capacitance operation mode, the sensor controller 200C may operate the input sensor 200 in the mutual-capacitance operation mode to generate accurate coordinate values corresponding to the points where the multi-touch is generated. The sensor controller 200C may exclude the second sensing period SP2 and the waiting period SBP from the third finger sensing frame IF2_3 and may generate a mutual sensing signal to operate the input sensor 200 in the mutual-capacitance operation mode. In this case, the third finger sensing frame IF2_3 may include a mutual sensing period MSP following the integrated sensing period TSP. During the mutual sensing period MSP, the sensor controller 200C may apply the mutual sensing signal to the input sensor 200. Accordingly, the sensor controller 200C may accurately calculate the coordinate values corresponding to the first and second points TP1 and TP2 by combining the self-capacitance sensing result with the mutual-capacitance sensing result.

Figure 15:
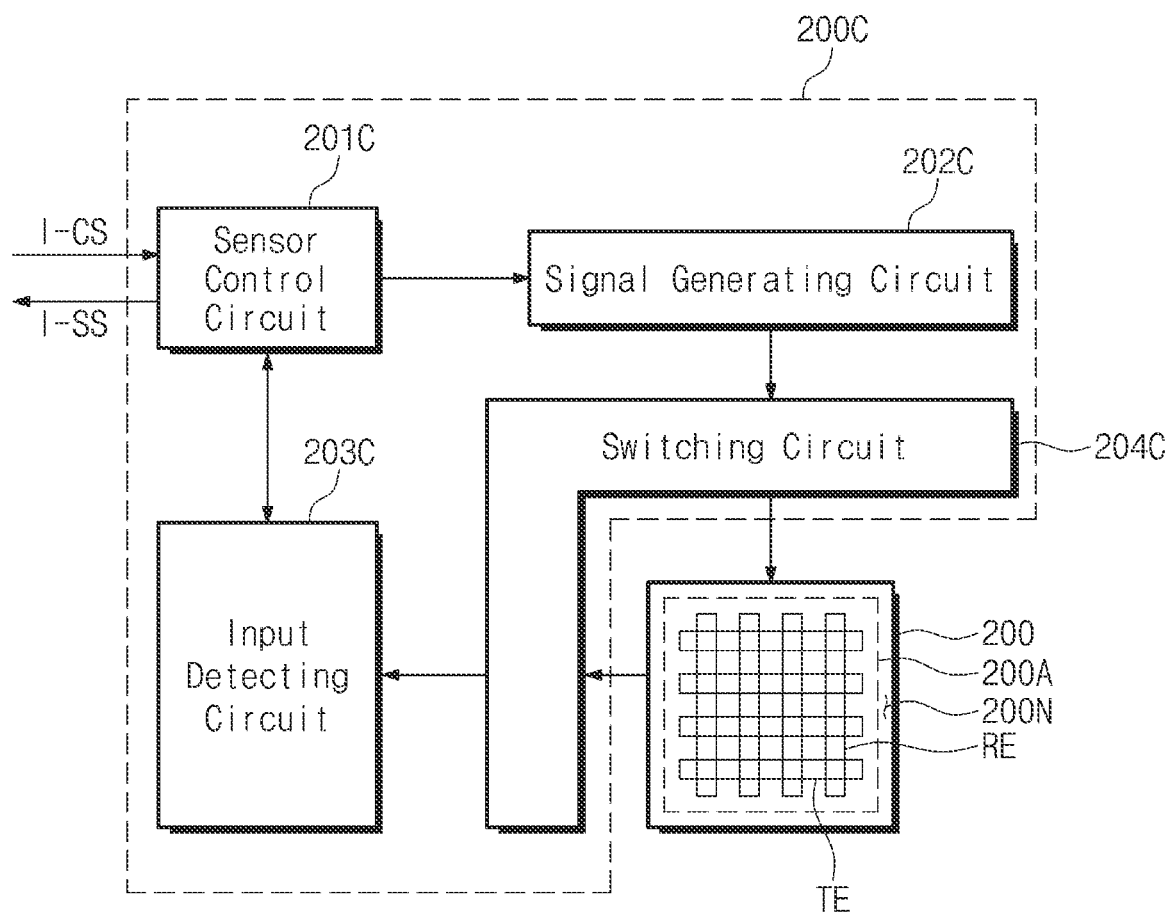
FIG. 15 is a block diagram showing an input sensor and a sensor controller according to an embodiment.
Figure 16:
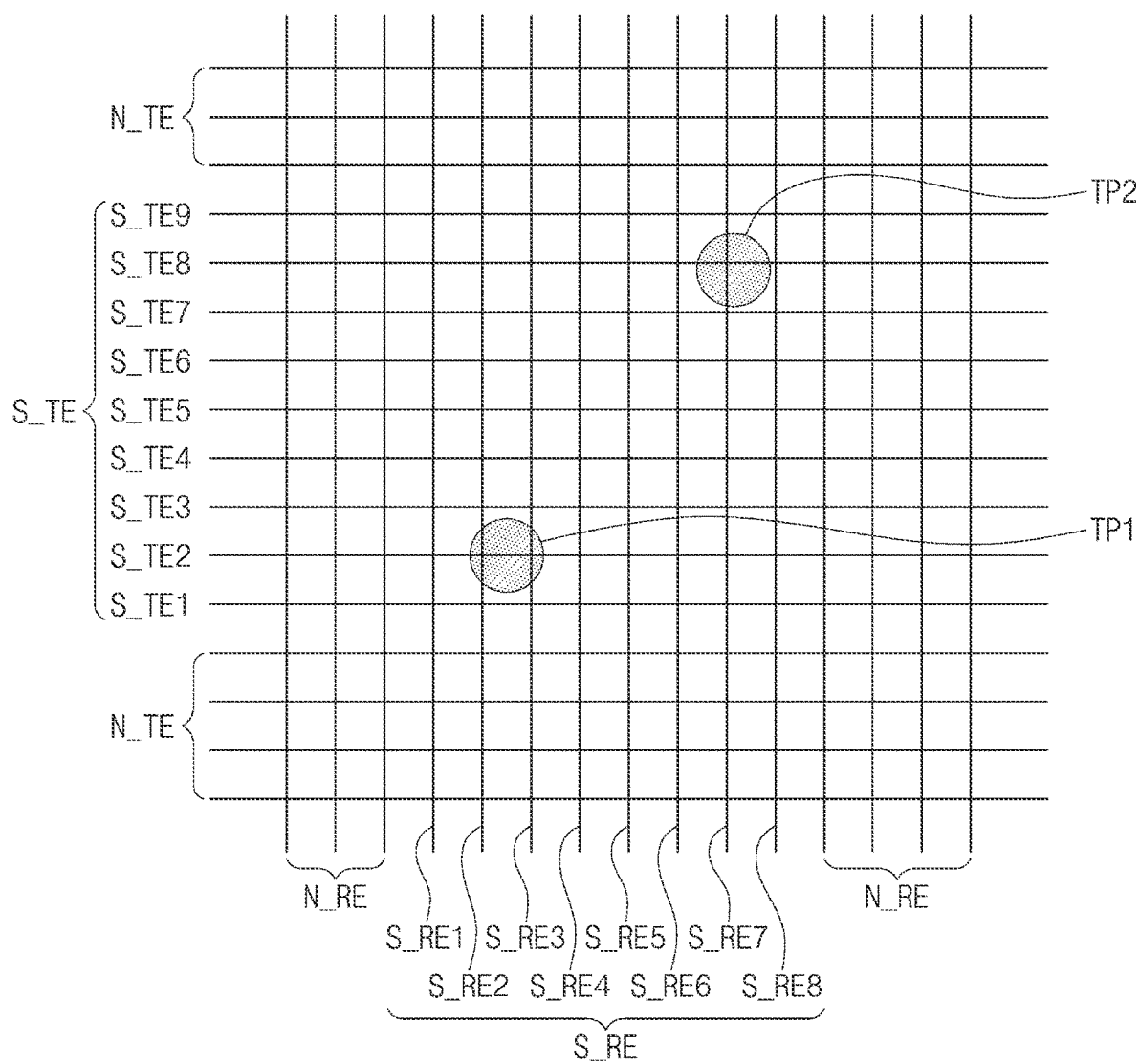
FIG. 16 is a schematic plan view showing a portion of an input sensor according to an embodiment.
Figure 17:
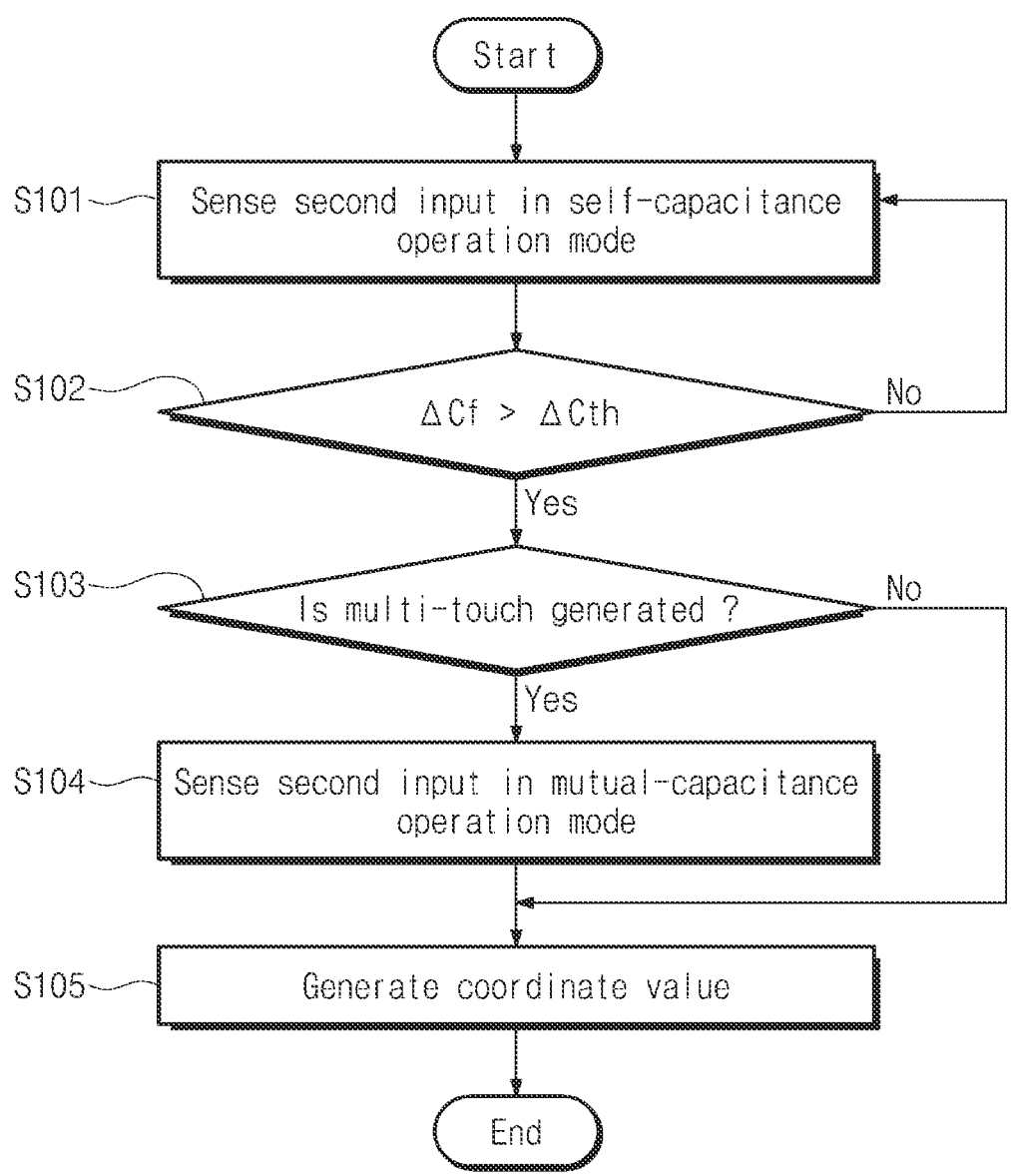
FIG. 17 is a flowchart showing an operation of an electronic device in a second mode according to an embodiment.

FIG. 15 is a block diagram showing the input sensor 200 and the sensor controller 200C according to an embodiment. FIG. 16 is a schematic plan view showing a portion of the input sensor 200 according to an embodiment. FIG. 17 is a flowchart showing an operation of the electronic device in the second mode according to an embodiment.

Referring to FIG. 15, the input sensor 200 may include a sensing area 200A and a non-sensing area 200N. The sensing area 200A may be activated in response to an electrical signal. The sensing area 200A may sense inputs. The sensing area 200A may overlap the active area AA1 (refer to FIG. 1) of the electronic device 1000 (refer to FIG. 1). The non-sensing area 200N may surround the sensing area 200A. The non-sensing area 200N may overlap the peripheral area NAA1 (refer to FIG. 1) of the electronic device 1000.

The input sensor 200 may include a plurality of transmission electrodes TE and a plurality of reception electrodes RE. Each of the transmission electrodes TE may extend in the first direction DR1, and the transmission electrodes TE may be arranged in the second direction DR2 and spaced from each other. Each of the reception electrodes RE may extend in the second direction DR2, and the reception electrodes RE may be arranged in the first direction DR1 and spaced from each other.

The reception electrodes RE may be insulated from the transmission electrodes TE and may cross the transmission electrodes TE. Each of the transmission electrodes TE and each of the reception electrodes RE may have a bar shape or a stripe shape. When the transmission electrodes TE and the reception electrodes RE have the bar or stripe shape, sensing characteristics corresponding to continuous linear inputs provided through the input device 2000 (refer to FIG. 3) may be desirable. The shape of the transmission electrodes TE and the shape of the reception electrodes RE may be configured according to embodiments.

The sensor controller 200C may receive a sensing control signal I-CS from the main controller 1000C (refer to FIG. 3) and may provide a coordinate signal I-SS to the main controller 1000C.

The sensor controller 200C may include a sensor control circuit 201C, a signal generating circuit 202C, an input detecting circuit 203C, and a switching circuit 204C. The sensor control circuit 201C, the signal generating circuit 202C, and the input detecting circuit 203C may be implemented in one or more chips.

The sensor control circuit 201C may control an operation of the signal generating circuit 202C and the switching circuit 204C. The sensor control circuit 201C may calculate the coordinate value of a second input from a driving signal received from the input detecting circuit 203C and/or may analyze information received from the input device 2000 based on a modulated signal from the input detecting circuit 203C.

The signal generating circuit 202C may generate and provide the integrated sensing signals, the search signals, and/or the mutual sensing signal to the input sensor 200. The signal generating circuit 202C may output search signals to the input sensor 200 in the first mode and may output at least one of integrated sensing signals, search signals, and mutual sensing signal to the input sensor 200 in the second mode.

The input detecting circuit 203C may receive a reception signal or a downlink signal from the input sensor 200. The input detecting circuit 203C may filter the reception signal and/or the downlink signal, may convert the reception signal and/or the downlink signal to the driving signal that is able to be processed by the sensor control circuit 201C, and may provide the driving signal to the sensor control circuit 201C.

The switching circuit 204C may selectively control an electrical connection relation between the input sensor 200 and the signal generating circuit 202C and/or an electrical connection relation between the input sensor 200 and the input detecting circuit 203C in response to the control of the sensor control circuit 201C. The switching circuit 204C may connect either the transmission electrodes TE or the reception electrodes RE to the signal generating circuit 202C or may connect both the transmission electrodes TE and the reception electrodes RE to the signal generating circuit 202C in response to the control of the sensor control circuit 201C. Selectively, the switching circuit 204C may connect one or both of the transmission electrodes TE and the reception electrodes RE to the input detecting circuit 203C.

The switching circuit 204C may connect either the transmission electrodes TE or the reception electrodes RE to the signal generating circuit 202C during the integrated sensing period TSP (refer to FIG. 10). Accordingly, during the integrated sensing period TSP, the first or second integrated sensing signal TTS1 or TTS2 (refer to FIG. 10) may be applied to either the transmission electrodes TE or the reception electrodes RE.

Referring to FIGS. 14, 15, and 16, the sensor controller 200C may partially drive the input sensor 200 in the mutual sensing period MSP. The switching circuit 204C may electrically connect some of the transmission electrodes TE to the signal generating circuit 202C. During the mutual sensing period MSP, the transmission electrodes TE may be selectively connected to the signal generating circuit 202C. The number and positions of the transmission electrodes TE connected to the signal generating circuit 202C may be changed depending on the positions where the multi-touch is generated. The transmission electrodes TE that are connected to the signal generating circuit 202C are referred to as sensing transmission electrodes S_TE, and the transmission electrodes TE that are not connected to the signal generating circuit 202C are referred to as non-sensing transmission electrodes N_TE. As an example, referring to FIG. 16, nine sensing transmission electrodes S_TE1, S_TE2, S_TE3, S_TE4, S_TE5, S_TE6, S_TE7, S_TE8, and S_TE9 may be selected and electrically connected to the signal generating circuit 202C. The signal generating circuit 202C may transmit mutual sensing signals to the sensing transmission electrodes S_TE1 to S_TE9.

The switching circuit 204C may electrically connect some of the reception electrodes RE to the input detecting circuit 203C. During the mutual sensing period MSP, the reception electrodes RE may be selectively connected to the input detecting circuit 203C. The number and position of the reception electrodes RE connected to the input detecting circuit 203C may be changed depending on the position where the multi-touch is generated. The reception electrodes RE that are connected to the input detecting circuit 203C are referred to as sensing reception electrodes S_RE, and the reception electrodes RE that are not connected to the input detecting circuit 203C are referred to as non-sensing reception electrodes N_RE. As an example, referring to FIG. 16, eight sensing reception electrodes S_RE1, S_RE2, S_RE3, S_RE4, S_RE5, S_RE6, S_RE7, and S_RE8 are selected and electrically connected to the input detecting circuit 203C. The input detecting circuit 203C may receive reception signals from the sensing reception electrodes S_RE1 to S_RE8.

The sensor control circuit 201C may calculate the coordinate values corresponding to the first and second points TP1 and TP2 (where the multi-touch is generated) based on the driving signals received from the input detecting circuit 203C.

Referring to FIGS. 14 and 17, when the electronic device enters the second mode, the sensor controller 200C starts to sense a second input in the self-capacitance operation mode (S101). The sensor controller 200C may transmit the first integrated sensing signal TTS1 (refer to FIG. 14) to the input sensor 200.

The sensor controller 200C may calculate an amount of variation in capacitance $\Delta Cf$ based on a finger capacitance measured by the input sensor 200 in the self-capacitance operation mode and may compare the amount of variation in capacitance $\Delta Cf$ with a predetermined threshold value $\Delta Cth$ (S102). If the amount of variation in capacitance $\Delta Cf$ is smaller than or equal to the threshold value $\Delta Cth$ according to the compared result, the process proceeds to the operation S101, and the sensor controller 200C may transmit the second integrated sensing signal TTS2 (refer to FIG. 14) to the input sensor 200.

If the amount of variation in capacitance $\Delta Cf$ is greater than the threshold value $\Delta Cth$ according to the compared result, the sensor controller 200C may determine whether a multi-touch is generated (S103). If it is determined that no multi-touch is generated, the sensor controller 200C may generate the coordinate value corresponding to the second input based on the amount of variation in capacitance $\Delta Cf$ (S105).

If it is determined that a multi-touch is generated, the sensor controller 200C may start to sense second inputs in the mutual-capacitance operation mode (S104). Accordingly, the coordinate values corresponding to the multi-touch may be generated in the mutual-capacitance operation mode based on the reception signals received from the input sensor 200 and the amount(s) of variation(s) in capacitance ΔCf measured in the self-capacitance operation mode (S105).

Even during the high-speed operation, second inputs may be sensed by using the self-capacitance operation mode and the mutual-capacitance operation mode together as needed. Therefore, the access of various types of input devices may be sensed, and satisfactory sensing performance for the second inputs may be attained.

Figure 18:
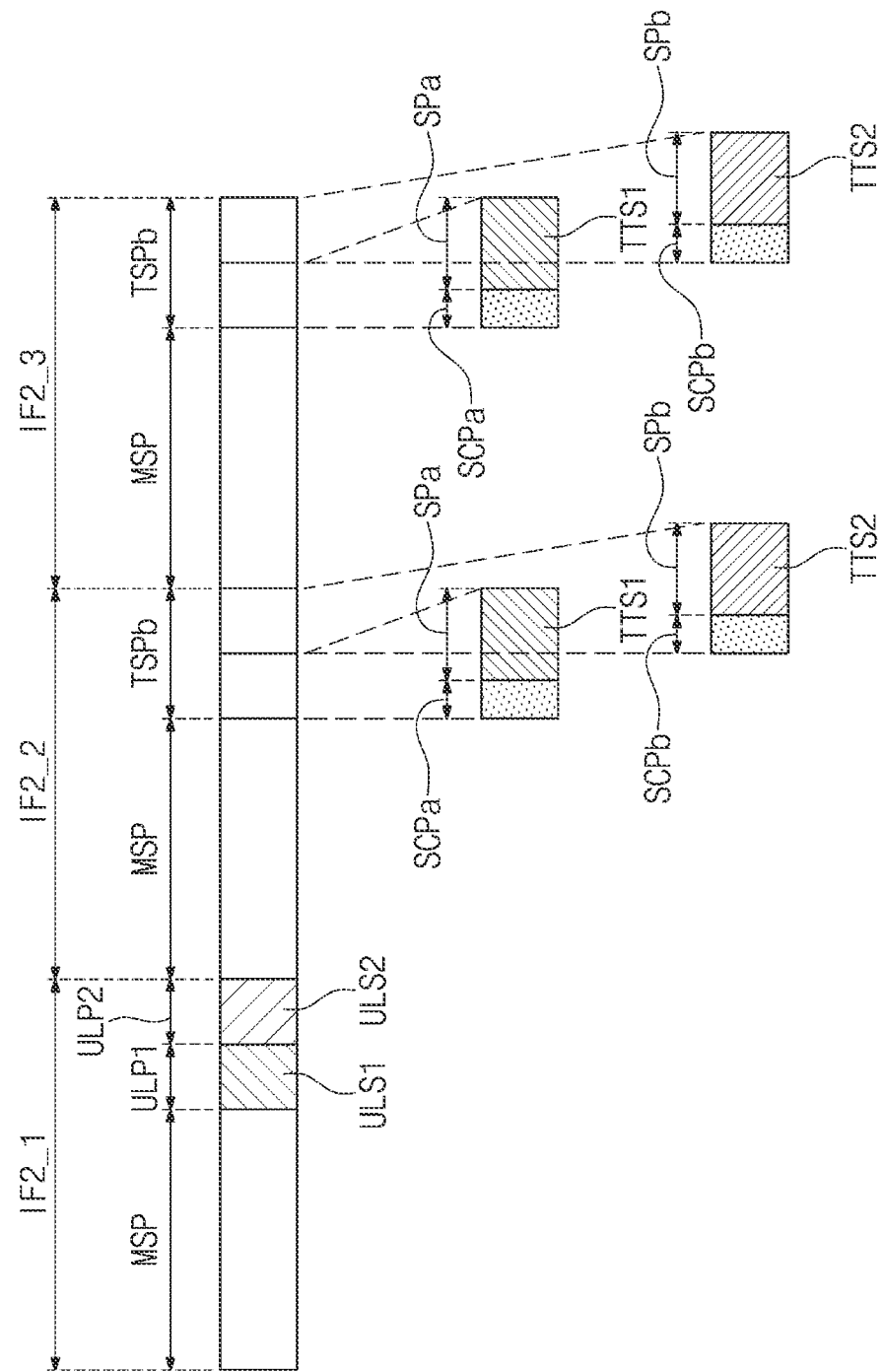
FIG. 18 is a conceptual diagram showing an operation of an electronic device in a second mode according to an embodiment.
Figure 19:
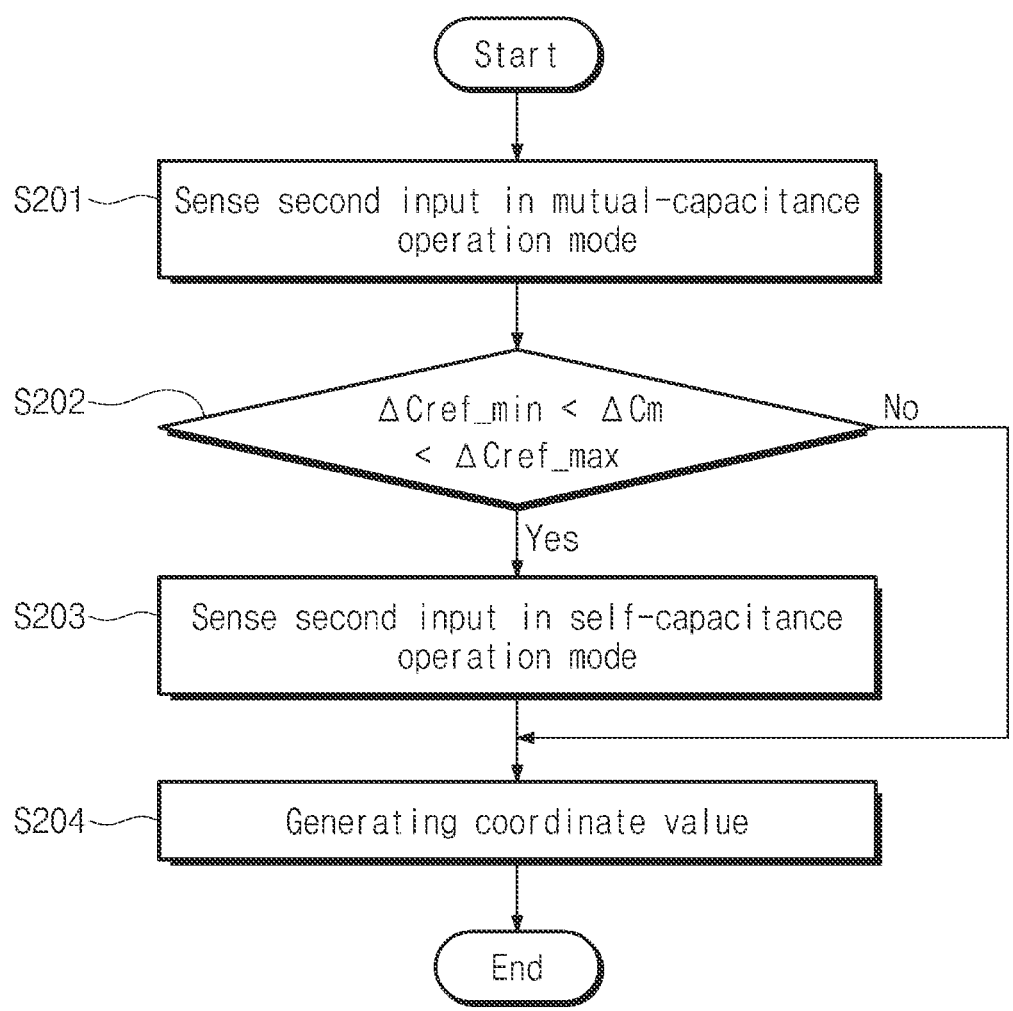
FIG. 19 is a flowchart showing an operation of an electronic device in a second mode according to an embodiment.

FIG. 18 is a conceptual diagram showing an operation of an electronic device in a second mode according to an embodiment. FIG. 19 is a flowchart showing an operation of the electronic device in the second mode according to an embodiment.

Referring to FIGS. 3, 18, and 19, when the electronic device enters the second mode, the sensor controller 200C may start to sense one or more second inputs in the mutual-capacitance operation mode (S201). In this case, each of the finger sensing frames IF2_1, IF2_2, and IF2_3 may include a mutual sensing period MSP. The sensor controller 200C may perform the sensing operation corresponding to second inputs during the mutual sensing period MSP of each of the finger sensing frames IF2_1 to IF2_3 in the second mode.

The sensor controller 200C may calculate an amount of variation in capacitance ΔCm based on the mutual capacitance measured by the input sensor 200 in the mutual-capacitance operation mode and may determine whether the amount of variation in capacitance ΔCm is within a predetermined reference range ΔCref_min to ΔCref_max (i.e., between the predetermined reference values ΔCref_min and ΔCref_max) (S202). If the amount of variation in capacitance ΔCm is not within the reference range ΔCref_min to ΔCref_max according to the determined result, the process proceeds to an operation S204, and the coordinate value(s) corresponding to the second input may be generated. That is, when the amount of variation in capacitance ΔCm is not within the reference range ΔCref_min to ΔCref_max, the sensor controller 200C may perform the sensing operation corresponding to the second input(s) only in the mutual-capacitance operation mode. In FIG. 18, the first finger sensing frame IF2_1 may correspond to the example in which the sensor controller 200C senses the second input only in the mutual-capacitance operation mode.

As an example, the first finger sensing frame IF2_1 may include a plurality of search periods, e.g., the first and second uplink periods ULP1 and ULP2, following the mutual sensing period MSP. Accordingly, the sensor controller 200C may sense the access of an input device 2000 in the finger sensing frames IF2_1 to IF2_3 in which second inputs are sensed. In particular, the sensor controller 200C may transmit the first search signal ULS1 to the input sensor 200 during the first uplink period ULP1, and the sensor controller 200C may transmit the second search signal ULS2 to the input sensor 200 during the second uplink period ULP2. The first and second search signals ULS1 and ULS2 may respectively support different protocols.

If the amount of variation in capacitance ΔCm is within the reference range ΔCref_min to ΔCref_max, the sensor controller 200C may start to sense a second input in the self-capacitance operation mode (S203). In FIG. 18, each of the second and third finger sensing frames IF2_2 and IF2_3 may correspond to the example in which the sensor controller 200C senses one or more second inputs in the mutual-capacitance operation mode and the self-capacitance operation mode. Each of the second and third finger sensing frames IF2_2 and IF2_3 may include the mutual sensing period MSP and an integrated sensing period TSPb. The integrated sensing period TSPb may follow the mutual sensing period MSP. The integrated sensing period TSPb may not (significantly) overlap the mutual sensing period MSP on the time axis.

The integrated sensing period TSPb may include a first sensing period SPa and a second sensing period SPb (enlarged for clarity in FIG. 18). During the first sensing period SPa, the sensor controller 200C may transmit the first integrated sensing signal TTS1 to the input sensor 200, and during second sensing period SPb, the sensor controller 200C may transmit the second integrated sensing signal TTS2 to the input sensor 200. The second sensing period SPb may follow the first sensing period SPa. The first sensing period SPa and the second sensing period SPb may not overlap each other on the time axis.

During the first sensing period SPa, the sensor controller 200C may transmit the first integrated sensing signal TTS1 to the input sensor 200 to search for an input device 2000 supporting the first protocol and to substantially simultaneously sense a second input in the self-capacitance operation mode. During the second sensing period SPb, the sensor controller 200C may transmit the second integrated sensing signal TTS2 to the input sensor 200 to search for an input device 2000 supporting the second protocol and to substantially simultaneously sense a second input in the self-capacitance operation mode. That is, in each of the second and third finger sensing frame periods IF2_2 and IF2_3, the input sensor 200 may operate in the self-capacitance operation mode and may sense the access of input devices 2000 respectively supporting different protocols.

The sensor controller 200C may generate the coordinate value(s) corresponding to the second input(s) based on the signal(s) received from the input sensor 200 in the mutual-capacitance operation mode and the amount(s) of variation (s) in capacitance measured in the self-capacitance operation mode (S204).

Even during the high-speed operation, second inputs may be sensed by using the self-capacitance operation mode and the mutual-capacitance operation mode together as needed. Therefore, the access of various types of input devices may be sensed, and satisfactory sensing performance for the second inputs may be attained.

Although example embodiments have been described, various changes and modifications can be made to the example embodiments and are within the scope specified by the attached claims.

What is claimed is:

1. An electronic device comprising:
   a display panel displaying an image;
   an input sensor disposed on the display panel; and
   a sensor controller electrically connected to the input sensor, providing search signals for searching at least one input device to the input sensor during a first search period of a first input sensing frame in a first mode, sensing at least one first input provided by the at least one input device through the input sensor in the first mode, generating at least one integrated signal using a sensing signal for sensing at least one second input in a second mode and at least one of the search signals, providing the at least one integrated signal to the input sensor during an integrated sensing period of a second input sensing frame in the second mode, and substantially simultaneously searching the at least one input device and sensing at least one second input in the second mode,
   wherein the search signals are communicated through different protocols, respectively.

2. The electronic device of claim 1, wherein the search signals comprise:
a first search signal communicated through a first protocol; and
a second search signal communicated through a second protocol different from the first protocol.

3. The electronic device of claim 2, wherein the at least one integrated signal comprises a first integrated sensing signal and a second integrated sensing signal, wherein the sensor controller generates the first integrated sensing signal using characteristics of the first search signal and characteristics of the sensing signal, wherein the sensor controller generates the second integrated sensing signal using characteristics of the second search signal and the characteristics of the sensing signal, wherein the integrated sensing period comprises a first sensing period and a second sensing period, wherein the sensor controller provides the first integrated sensing signal to the input sensor in the first sensing period, and wherein the sensor controller provides the second integrated sensing signal to the input sensor in the second sensing period.

4. The electronic device of claim 3, wherein the integrated sensing period further comprises a first synchronization period and a second synchronization period, wherein the first synchronization period precedes the first sensing period, wherein the second synchronization period is positioned between the first sensing period and the second sensing period, wherein the sensor controller provides exactly one of an instance of the first search signal and a first instance of the sensing signal to the input sensor in the first synchronization period, and wherein the sensor controller provides exactly one of an instance of the second search signal and a second instance of the sensing signal to the input sensor in the second synchronization period.

5. The electronic device of claim 2, wherein the at least one integrated signal comprises a first integrated sensing signal, wherein the sensor controller generates the first integrated sensing signal using characteristics of the first search signal and characteristics of the sensing signal, wherein the integrated sensing period comprises a sensing period and a second search period, wherein the sensor controller provides the first integrated sensing signal to the input sensor in the sensing period, and wherein the sensor controller provides the second search signal to the input sensor in the second search period.

6. The electronic device of claim 5, wherein the integrated sensing period further comprises a first synchronization period preceding the first sensing period, and wherein the sensor controller provides exactly one of an instance of the first search signal and an instance of the sensing signal to the input sensor in the first synchronization period.

7. The electronic device of claim 2, wherein the second input sensing frame further comprises a waiting period, wherein the sensor controller waits for a third search signal in the waiting period, and wherein the third search signal is communicated through a third protocol different from each of the first protocol and the second protocol.

8. The electronic device of claim 2, wherein the first search period comprises a first uplink period and a second uplink period, wherein the sensor controller provides the first search signal to the input sensor in the first uplink period, wherein the sensor controller provides the second search signal to the input sensor in the second uplink period, and wherein the first uplink period and the second uplink period do not overlap each other in time.

9. The electronic device of claim 8, wherein the first search period further comprises a first response period and a second response period respectively following the first uplink period and the second uplink period, wherein the sensor controller receives a first response signal corresponding to the first search signal or waits for the first response signal, wherein the sensor controller receives a second response signal corresponding to the second search signal or waits for the second response signal, wherein the first response period does not overlap the second uplink period, and wherein the second response period does not overlap the first uplink period.

10. The electronic device of claim 9, wherein the first input sensing frame further comprises a communication period following the first search period, and wherein the sensor controller senses the at least one first input in the communication period.

11. The electronic device of claim 10, wherein the communication period comprises a downlink period, wherein the sensor controller performs data communication a first input device supporting the first protocol in the downlink period, wherein the first response signal is received during the first response period, and wherein no second response signal is received during the second response period.

12. The electronic device of claim 10, wherein the communication period comprises a downlink period, wherein the sensor controller performs data communication with a second input device supporting the second protocol in the downlink period, wherein no first response signal is received during the first response period, and wherein the second response signal is received during the second response period.

13. The electronic device of claim 10, wherein the first response signal is received during the first response period, wherein the second response signal is received during the second response period, wherein the communication period comprises a first downlink period and a second downlink period, wherein the sensor controller performs first data communication with a first input device supporting the first protocol in the first downlink period, and wherein the sensor controller performs second data communication with a second input device supporting the second protocol in the second downlink period.

14. The electronic device of claim 13, wherein the first downlink period does not overlap the second downlink period in time.

15. The electronic device of claim 1, wherein the second input sensing frame further comprises a mutual-capacitance sensing period, and wherein the sensor controller provides a mutual-capacitance sensing signal to the input sensor in the mutual- capacitance sensing period.

16. The electronic device of claim 15, wherein the input sensor comprises:
first sensing electrodes; and
second sensing electrodes electrically insulated from the first sensing electrodes.

17. The electronic device of claim 16, wherein the sensor controller transmits instances of the mutual-capacitance sensing signal to some of the first sensing electrodes and receives instances of a reception signal corresponding to the mutual- capacitance sensing signal from some of the second sensing electrodes during the mutual- capacitance sensing period.

18. The electronic device of claim 16, wherein the sensor controller selects either the first sensing electrodes or the second sensing electrodes as selected sensing electrodes and provides instances of the at least one integrated signal to the selected sensing electrodes during the integrated sensing period.

19. The electronic device of claim 15, wherein the integrated sensing period precedes the mutual-capacitance sensing period in the second input sensing frame.

20. The electronic device of claim 15, wherein the mutual-capacitance sensing period precedes the integrated sensing period in the second input sensing frame.

* * * * *